United States Patent
Lee

(10) Patent No.: US 10,403,729 B2
(45) Date of Patent: Sep. 3, 2019

(54) SEMICONDUCTOR DEVICES AND CONTACT PLUGS

(71) Applicant: Samsung Electronics Co., Ltd., Suwon-si, Gyeonggi-do (KR)

(72) Inventor: Eui-bok Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/833,148

(22) Filed: Dec. 6, 2017

(65) Prior Publication Data

US 2018/0182856 A1    Jun. 28, 2018

(30) Foreign Application Priority Data

Dec. 22, 2016 (KR) .................. 10-2016-0176838

(51) Int. Cl.

| | |
|---|---|
| H01L 23/48 | (2006.01) |
| H01L 29/78 | (2006.01) |
| H01L 21/768 | (2006.01) |
| H01L 23/485 | (2006.01) |
| H01L 23/522 | (2006.01) |
| H01L 23/528 | (2006.01) |

(Continued)

(52) U.S. Cl.
CPC .... *H01L 29/4232* (2013.01); *H01L 21/76805* (2013.01); *H01L 21/76849* (2013.01); *H01L 23/481* (2013.01); *H01L 23/485* (2013.01); *H01L 23/5226* (2013.01); *H01L 23/5283* (2013.01); *H01L 29/4238* (2013.01); *H01L 29/785* (2013.01); *H01L 23/53238* (2013.01); *H01L 23/53252* (2013.01); *H01L 23/53266* (2013.01)

(58) Field of Classification Search
None
See application file for complete search history.

(56) References Cited

U.S. PATENT DOCUMENTS

| | | |
|---|---|---|
| 5,747,379 A | 5/1998 | Huang et al. |
| 5,861,671 A | 1/1999 | Tsai et al. |

(Continued)

FOREIGN PATENT DOCUMENTS

| | | |
|---|---|---|
| JP | 2007-042662 A | 2/2007 |
| JP | 2008-071980 A | 3/2008 |

(Continued)

OTHER PUBLICATIONS

Yeh, M.S. et al., "Effect of Cu Line Capping Process on Stress Migration Reliability," IITC, Jun. 2006, pp. 113-115.

(Continued)

*Primary Examiner* — Telly D Green
(74) *Attorney, Agent, or Firm* — Harness, Dickey & Pierce, P.L.C.

(57) ABSTRACT

A semiconductor device has a high electric connection reliability and includes a base substrate having a connection target layer, a lower contact plug formed over the base substrate and electrically connected to the connection target layer, and an upper contact plug formed over the lower contact plug, wherein the lower contact plug includes a lower plug layer having a gap portion extending inward from a top portion of the lower plug layer, a gap cover layer filling the gap portion, and an upper cover layer covering a top surface of the lower plug layer.

13 Claims, 28 Drawing Sheets

(51) Int. Cl.
*H01L 23/532* (2006.01)
*H01L 29/423* (2006.01)

(56) References Cited

U.S. PATENT DOCUMENTS

| | | | |
|---|---|---|---|
| 6,028,362 A | 2/2000 | Omura | |
| 6,221,754 B1 * | 4/2001 | Chiou | H01L 21/76877 |
| | | | 257/E21.585 |
| 6,265,257 B1 * | 7/2001 | Hsu | H01L 21/7684 |
| | | | 257/E21.583 |
| 6,653,737 B2 | 11/2003 | Horak et al. | |
| 7,034,398 B2 | 4/2006 | Kajita et al. | |
| 7,335,588 B2 | 2/2008 | Yang et al. | |
| 7,956,386 B2 | 6/2011 | Bae et al. | |
| 8,021,974 B2 * | 9/2011 | Yang | H01L 21/76832 |
| | | | 257/E21.013 |
| 8,034,710 B2 | 10/2011 | Yang et al. | |
| 8,084,354 B2 | 12/2011 | Kahlert et al. | |
| 8,432,035 B2 | 4/2013 | Kahlert et al. | |
| 8,940,635 B1 | 1/2015 | Chi et al. | |
| 2006/0163739 A1 | 7/2006 | Komai et al. | |

FOREIGN PATENT DOCUMENTS

| | | |
|---|---|---|
| JP | 2010-050190 A | 3/2010 |
| KR | 2010-0011490 A | 2/2010 |
| KR | 2010-0076548 A | 7/2010 |
| KR | 10-1001151 B1 | 12/2010 |

OTHER PUBLICATIONS

Jen-Pan Wang et al. "Effects of Surface Cleaning on Stressvoiding and Electromigration of Cu-Damascene Interconnection" IEEE Transactions on Device and Materials Reliability, vol. 8, No. 1, Mar. 1, 2008.

* cited by examiner

SEMICONDUCTOR DEVICES AND CONTACT PLUGS

CROSS-REFERENCE TO RELATED APPLICATION

This application claims the benefit of priority from Korean Patent Application No. 10-2016-0176838, filed on Dec. 22, 2016, in the Korean Intellectual Property Office, the disclosure of which is incorporated herein in its entirety by reference.

BACKGROUND

The inventive concepts relate to a semiconductor device, and more particularly, to a semiconductor device including a contact plug.

According to the current state of electronic technology, a semiconductor device typically requires a fast operation speed. Recently, down-scaling of the semiconductor device is rapidly performed for a quick operation speed, and because of reductions of design of semiconductor devices, an electric resistance between components of the semiconductor device typically increases.

SUMMARY

The inventive concepts relate to a semiconductor device having high electric connection reliability by reducing the electric resistance between components of the semiconductor device.

According to some example embodiments of the inventive concepts, a semiconductor device includes a base substrate having a connection target layer, a lower contact plug formed over the base substrate and electrically connected to the connection target layer, and an upper contact plug formed over the lower contact plug, wherein the lower contact plug includes a lower plug layer having a gap portion extending inward from a top portion of the lower plug layer, a gap cover layer filling the gap portion, and an upper cover layer covering a top surface of the lower plug layer.

According to example embodiments of the inventive concepts, a semiconductor device includes a substrate having an active region, a gate electrode provided over a portion of the active region, a lower inter-wire insulating layer located over the gate electrode and having a lower contact hole, a lower contact plug filling the lower contact hole and connected to the gate electrode, an upper inter-wire insulating layer provided over the lower inter-wire insulating layer and including an upper contact hole, and an upper contact plug filling the upper contact hole and connected to the lower contact plug, wherein the lower contact plug includes a lower barrier layer covering inner side and bottom surfaces of the lower contact hole, a lower plug layer formed over the lower barrier layer to fill a portion of the lower contact hole, and including a gap portion extending inward from a top portion of the lower plug layer, a gap cover layer filling the gap portion, and an upper cover layer covering a portion of a top surface of the lower plug layer, which overlaps a bottom surface of the upper contact hole, and a top surface of the gap cover layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Example embodiments of the inventive concepts will be described with reference to accompanying drawings, for sufficient understanding of composition and effects of the inventive concepts.

Figure 1:
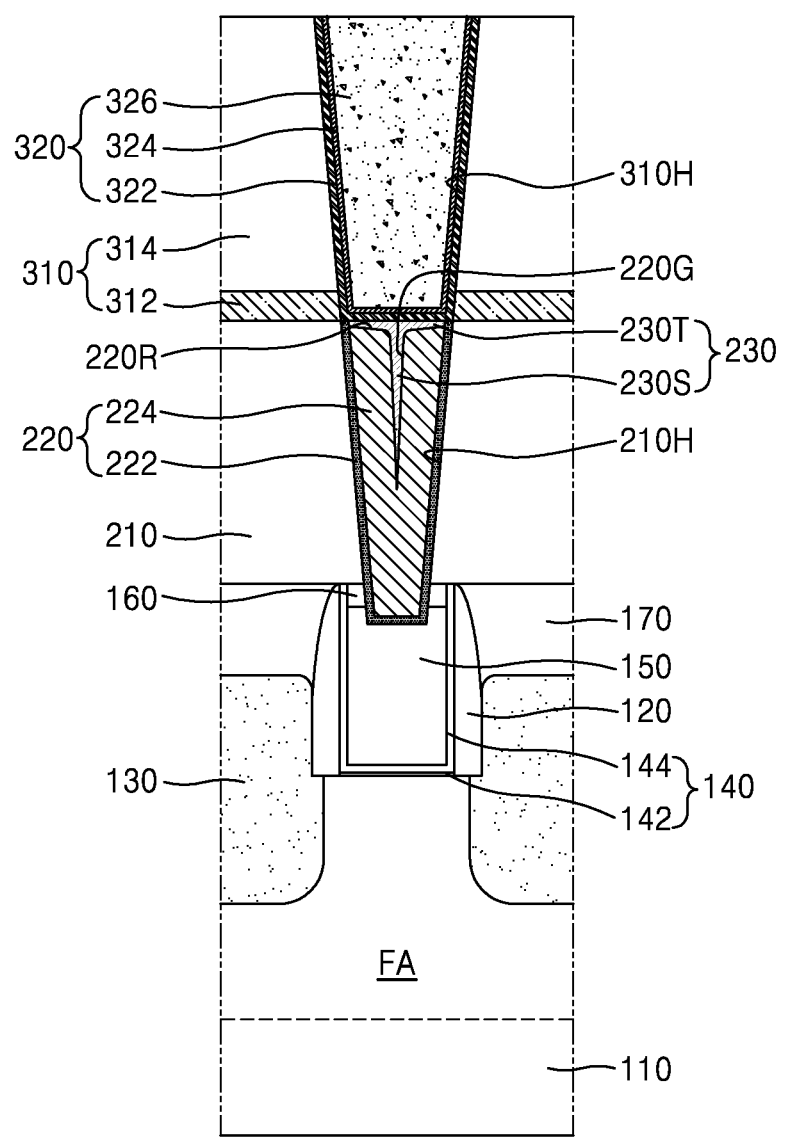
FIG. 1 is a cross-sectional view of a semiconductor device according to an example embodiment.

FIG. 1 is a cross-sectional view of a semiconductor device 1000 according to an example embodiment.

Referring to FIG. 1, the semiconductor device 1000 may include a substrate 110, a gate electrode 150 located over the substrate 110, and lower contact plugs 220 and 230 electrically connected to the gate electrode 150. The gate electrode 150 may be referred to as a connection target layer to which the lower contact plugs 220 and 230 are to be connected.

The substrate 110 may include a semiconductor material. The substrate 110 may be formed of or include at least one of a Group III-V material and a Group IV material. The substrate 110 may include, for example, silicon (Si). Alternatively, the substrate 110 may include a semiconductor element, such as germanium (Ge), or a compound semiconductor material, such as silicon germanium (SiGe), silicon carbide (SiC), gallium arsenide (GaAs), indium arsenide (InAs), or indium phosphide (InP). The Group III-V material may be a binary, ternary, or quaternary system compound including at least one Group III element and at least one Group V element. The Group III-V material may be a component including at least one of In, Ga, and Al as a Group III element, and at least one of As, P, and Sb as a Group V element. For example, the Group III-V material may be selected from among InP, $In_zGa_{1-z}As$ (0≤z≤1), and $Al_zGa_{1-z}As$ (0≤z≤1). The binary system compound may be one of, for example, InP, GaAs, InAs, InSb, and GaSb. The ternary system compound may be one of InGaP, InGaAs, AlInAs, InGaSb, GaAsSb, and GaAsP. The Group IV material may be Si or Ge. However, examples of the Group III-V material and Group IV material usable in a semiconductor device are not limited thereto. The Group III-V material and the Group IV material, such as Ge, may be used as a channel material for preparing a high speed transistor having low power consumption. A high performance complementary metal-oxide semiconductor (CMOS) may be formed by using a semiconductor substrate formed of or include a Group III-V material having high mobility of electrons compared to an Si substrate, such as GaAs, and a semiconductor substrate formed of or include a semiconductor material having high mobility of holes, compared to an Si substrate, such as Ge. In some example embodiments, when an N-channel metal oxide semiconductor (NMOS) transistor is formed over the substrate 110, the substrate 110 may be formed of or include any one of the Group III-V materials stated above. In other example embodiments, when a P-channel metal oxide semiconductor (PMOS) transistor is formed over the substrate 110, at least a part of the substrate 110 may be formed of or include Ge. In some example embodiments, the substrate 110 may have a silicon-on-insulator (SOI) structure or a germanium-on-insulator (GOI) structure. For example, the substrate 110 may include a buried oxide (BOX) layer. The substrate 110 may include a conductive region, for example, an impurity-doped well. The substrate 110 may have any one of various device separating structures, such as a shallow trench isolation (STI) structure and a deep trench isolation (DTI) structure.

In some example embodiments, the substrate 110 may include a fin-type active region FA protruding perpendicular to a main surface of the substrate 110. The fin-type active region FA may extend along a direction parallel to the main surface of the substrate 110. A plurality of the fin-type active regions FA may extend and be disposed at certain intervals.

The gate electrode 150 may cross over a part of the fin-type active region FA and extend along one direction. The extending direction of the gate electrode 150 may cross the extending direction of the fin-type active region FA at right angles.

A gate insulating layer 140 may be disposed between the fin-type active region FA and the gate electrode 150. The gate electrode 150 may be formed to cover the gate insulating layer 140 over a top surface and two side walls of the fin-type active region FA.

The gate insulating layer 140 may be formed of or include silicon oxide, silicon nitride, silicon oxynitride, gallium oxide, germanium oxide, high dielectric material, or a combination thereof.

The gate insulating layer 140 may include an interface film 142 having a first dielectric constant, and a high dielectric film 144 formed over the interface film 142 and having a second dielectric constant, the second dielectric constant being higher than the first dielectric constant. The interface film 142 between the fin-type active region FA and the lower surface of the gate electrode 150 may face a lower surface of the gate electrode 150, and the high dielectric film 144 may face a lower surface and two side walls of the gate electrode 150.

The interface film 142 may be formed of or include a low dielectric material having a dielectric constant lower than or equal to about 9, such as silicon oxide, silicon nitride, silicon oxynitride, gallium oxide, or germanium oxide, but is not limited thereto. The interface film 142 may be oxide, nitride, or oxynitride of a material forming the substrate 110. The interface film 142 may have a thickness of about 5 to 20 Å, but is not limited thereto. The interface film 142 may be formed by a thermal oxidation process, an atomic layer deposition (ALD) process, a chemical vapor deposition (CVD) process, or a physical vapor deposition (PVD) process.

The high dielectric film 144 may be formed of or include a high dielectric material having a dielectric constant of about 10 to 25, which is higher than the interface film 142. The high dielectric film 144 may be formed of or include a material having a higher dielectric constant than, for example, a silicon oxide film and a silicon nitride film. The high dielectric film 144 may be formed of or include a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a compound thereof, but a material forming the high dielectric film 144 is not limited thereto. The high dielectric film 144 may be formed by an ALD process, a CVD process, or a PVD process. The high dielectric film 144 may have a thickness of about 10 to 40 Å, but is not limited thereto.

The gate electrode 150 may be formed of or include, for example, at least one metal selected from among Ti, Ta, Al, W, Ru, Nb, Mo, Hf, Ni, Co, Pt, Yb, Tb, Dy, Er, and Pd, metal nitride including the at least one metal, or a metal compound, such as a carbon-doped metal or a carbon-doped metal nitride.

The gate electrode 150 may be a single layer or a multilayer including a plurality of layers. The gate electrode 150 may include, for example, a work function-adjusting metal-containing layer and a gap-filling metal-containing layer for filling a space formed at an upper portion of the work function-adjusting metal-containing layer.

In some example embodiments, the gate electrode 150 may have a structure in which a metal nitride layer, a metal layer, a conductive capping layer, and a gap-fill metal layer are stacked, for example sequentially stacked on each other. The metal nitride layer and the metal layer may each include at least one metal element selected from among Ti, W, Ru, Nb, Mo, Hf, Ni, Co, Pt, Yb, Tb, Dy, Er, and Pd. The metal nitride layer and the metal layer may each be formed by an ALD process, a metal organic ALD (MOALD) process, or a metal organic CVD (MOCVD) process. The conductive capping layer may operate as a protection layer reducing or preventing oxidation of a surface of the metal layer. Also, the conductive capping layer may operate as a wetting layer enabling another conductive layer to be easily deposited over the metal layer. The conductive capping layer may be formed of or include metal nitride, such as TiN or TaN, or a combination thereof, but is not limited thereto. The gap-fill metal layer may extend over the conductive capping layer. The gap-fill metal layer may be a W layer. The gap-fill metal layer may be formed by an ALD process, a CVD process, or a PVD process. The gap-fill metal layer may embed, without a void, a recess space formed by a stepped portion between regions at a top surface of the conductive capping layer. In some example embodiments, the gate electrode 150 may have a stacked structure of TiAlC/TiN/W, a stacked structure of TiN/TaN/TiAlC/TiN/W, or a stacked structure of TiN/TaN/TiN/TiAlC/TiN/W. In such stacked structures, a TiAlC layer or a TiN layer may operate as a work function-adjusting metal-containing layer.

A pair of source/drain regions 130 may be provided at two sides of the gate electrode 150 in the fin-type active region FA. The pair of source/drain regions 130 may include a semiconductor layer epitaxially-grown from the fin-type active region FA. The source/drain regions 130 may have an embedded SiGe structure including a plurality of epitaxially-grown SiGe layers, or may include an epitaxially-grown Si layer or an epitaxially-grown SiC layer.

A transistor may be formed at a region where the fin-type active region FA and the gate electrode 150 cross each other. The transistor may be an MOS transistor having a 3-dimensional (3D) structure, in which a channel is formed at the top surface and the two side surfaces of the fin-type active region FA. The MOS transistor may be an NMOS or PMOS transistor.

A pair of insulating spacers 120 may be formed over two side walls of the gate insulating layer 140 and the gate electrode 150, which are formed, for example sequentially formed on a surface of the fin-type active region FA. An interlayer insulating layer 170 covering the insulating spacers 120 may be formed at an opposite side of the gate electrode 150 based on the insulating spacers 120. The insulating spacer 120 may include a silicon nitride film, a silicon oxynitride film, a carbon-containing silicon oxynitride film, or a composite film thereof, or may have an air gap therein or have a low dielectric film, and the interlayer insulating layer 170 may include a silicon oxide film like gate insulating layer 140, but are not limited thereto.

The gate insulating layer 140 may be formed to cover an inner surface of a space limited between the pair of insulating spacers 120. The gate electrode 150 may be formed to cover over the gate insulating layer 140 and fill a space limited between the pair of insulating spacers 120. In some example embodiments, only the high dielectric film 144 of the gate insulating layer 140 is formed over an inner side wall of the insulating spacer 120, and the interface film 142 may be omitted. In some example embodiments, a gate capping layer 160 covering a top surface of the gate electrode 150 may be formed at an upper portion of the space limited between the pair of insulating spacers 120. The gate capping layer 160 may include, for example, a silicon nitride film, but is not limited thereto.

In some example embodiments, the insulating spacer 120 may have a multilayer structure. In some example embodiments, an air gap may be provided inside the insulating spacer 120 having the multilayer structure.

In some example embodiments, the gate insulating layer 140 and the gate electrode 150 may be formed by replacement gate processes of first forming a dummy gate insulating layer and a dummy gate electrode over the fin-type active region FA, forming the insulating spacers 120, removing the dummy gate electrode and the dummy gate insulating layer, and then forming the gate insulating layer 140 covering an inner surface of the space limited between the pair of insulating spacers 120 and the gate electrode 150 filling a space limited between the pair of insulating spacers 120.

In some example embodiments, the semiconductor device 1000 may further include a nano-sheet stacked structure facing a top surface of the fin-type active region FA at a location spaced apart from the top surface of the fin-type active region FA. The nano-sheet stacked structure may include a plurality of nano-sheets extending in parallel to the top surface of the fin-type active region FA. The plurality of nano-sheets may include a channel region. The gate electrode 150 may surround at least a part of the channel region. The nano-sheet may be formed of or include a Group IV semiconductor, a Group IV-IV compound semiconductor, or a Group III-V compound semiconductor. For example, the nano-sheet may be formed of or include Si, Ge, or SiGe, or may be formed of or include InGaAs, InAs, GaSb, InSb, or a combination thereof. When the semiconductor device 1000 further includes the nano-sheet stacked structure, the gate insulating layer 140 may be disposed between the channel region and the gate electrode 150. The source/drain regions 130 may contact two end portions of the plurality of nano-sheets, and the two end portions of the plurality of nano-sheets, which are adjacent to the source/drain regions 130, may be covered by the insulating spacers 120 covering side walls of the gate electrode 150. A pair of inner insulating spacers may be formed between the fin-type active region FA and the nano-sheet. The pair of inner insulating spacers may be disposed between the gate electrode 150 and the source/drain regions 130. The inner insulating spacers may be formed of or include a material different from that of the gate insulating layer 140. The inner insulating spacer may be formed of or include a material having a lower dielectric constant than the dielectric constant of a material forming the gate insulating layer 140. For example, the inner insulating spacer may be formed of or include oxide of a material forming the nano-sheet, but is not limited thereto. The gate insulating layer 140 may extend from a surface of the channel region of the nano-sheet to a surface of a side wall of the inner insulating spacer such as to be disposed between the gate electrode 150 and the inner insulating spacer, between the fin-type active region FA and the nano-sheet.

The lower contact plugs 220 and 230 electrically connected to the gate electrode 150 may be formed over the gate electrode 150. The lower contact plugs 220 and 230 may fill a lower contact hole 210H penetrating through a lower inter-wire insulating layer 210. After the lower inter-wire insulating layer 210 covering the gate electrode 150 and the interlayer insulating layer 170 are formed, a part of the lower inter-wire insulating layer 210 may be removed to form the lower contact hole 210H. The lower contact hole 210H may also penetrate through the gate capping layer 160 and expose a part of the gate electrode 150 at a bottom surface of the lower contact hole 210H. The lower contact plugs 220 and 230 may contact the gate electrode 150 by penetrating through the gate capping layer 160. In some example embodiments, the lower contact plugs 220 and 230 may be formed of or include a metal material, such as W, Cu, Ti, Ta, Ru, Mn, or Co. metal nitride, such as TiN, TaN, CoN, or WN, or an alloy, such as cobalt tungsten phosphide (CoWP), cobalt tungsten boron (CoWB), or a cobalt tungsten boron phosphide (CoWBP).

The lower contact plugs 220 and 230 may include a plug base layer 220 and a plug cover layer 230 formed over the plug base layer 220.

The plug base layer 220 may include a lower barrier layer 222 and a lower plug layer 224. The lower barrier layer 222 may be formed to cover inner side and bottom surfaces of the lower contact hole 210H. The lower plug layer 224 may be formed over the lower barrier layer 222 to fill a portion of the lower contact hole 210H. Accordingly, the lower barrier layer 222 may cover side and lower surfaces of the lower plug layer 224.

An uppermost portion of the lower plug layer 224 may be located at a level lower than an uppermost portion of the lower barrier layer 222. A portion of the uppermost portion of the lower barrier layer 222 may not be covered by the lower plug layer 224.

The lower plug layer 224 may be formed over the lower barrier layer 222 to limit a gap portion 220G at a center of the lower plug layer 224. The uppermost portion of the lower plug layer 224 may be located at a level lower than the uppermost portion of the lower barrier layer 222. Accordingly, a recess portion 220R communicating with the gap portion 220G and limited by the lower barrier layer 222 and the lower plug layer 224 may be located at an upper portion of the lower contact hole 210H. The recess portion 220R may be a space limited by a side surface of the lower barrier layer 222, from a level of the uppermost portion of the lower barrier layer 222 to the top surface of the lower plug layer 224.

The gap portion 220G may extend into the lower plug layer 224 from the recess portion 220R, i.e., from the top portion of the lower plug layer 224. The gap portion 220G may not extend up to a lower surface of the lower plug layer 224. In other words, opposite sides of the lower plug layer 224 may be spaced apart from each other by the gap portion 220G. In some example embodiments, the gap portion 220G may have a depth of 0.1 to 50 nm and a width of 0.1 to 30 nm. For example, the gap portion 220G may have a depth of 0.1 to 10 nm and a width of 0.1 to 5 nm.

The plug cover layer 230 may fill the gap portion 220G and the recess portion 220R. The plug cover layer 230 may include an upper cover layer 230T filling the recess portion 220R, and a gap cover layer 230S filling the gap portion 220G. In some example embodiments, the upper cover layer 230T and the gap cover layer 230S forming the plug cover layer 230 may be integrally formed. In some example embodiments, the plug cover layer 230 may be formed of or include a different type of material from that of the lower plug layer 224. For example, a metal material forming the plug cover layer 230 and a metal material forming the lower plug layer 224 may be different metals. For example, the upper cover layer 230T of the plug cover layer 230 may be a portion filling the recess portion 220R so as to cover an upper portion of the lower plug layer 224, which is recessed from the uppermost portion of the lower contact hole 210H, and the gap cover layer 230S may be a portion filing the gap portion 220G limited by the lower plug layer 224 covering an inner wall of the lower barrier layer 222. A side wall of the upper cover layer 230T may contact an inner wall of a portion from the uppermost portion of the lower barrier layer 222, which is not covered by the lower plug layer 224. In some example embodiments, the gap cover layer 230S may have a depth of 0.1 to 50 nm and a width of 0.1 to 30 nm. For example, the gap cover layer 230S may have a depth of 0.1 to 10 nm and a width of 0.1 to 5 nm. In some example embodiments, the width of the gap cover layer 230S may decrease towards the lower surface of the lower plug layer 224, and since the gap portion 220G does not extend up to the lower surface of the lower plug layer 224, the gap cover layer 230S may also not extend up to the lower surface of the lower plug layer 224. In some example embodiments, the upper cover layer 230T may have a thickness of 0.1 to 10 nm. For example, the upper cover layer 230T may have a thickness of 0.1 to 3 nm.

In some example embodiments, the upper cover layer 230T may not be formed over the top surface of the uppermost portion of the lower barrier layer 222. The upper cover layer 230T may cover a portion of the top surface of the lower barrier layer 222, which overlaps a bottom surface of an upper contact hole 310H to be described below, and the top surface of the gap cover layer 230S.

In some example embodiments, the lower plug layer 224 may be surrounded by the lower barrier layer 222 and the plug cover layer 230.

An upper inter-wire insulating layer 310 including the upper contact hole 310H may be formed over the lower inter-wire insulating layer 210 and the lower contact plugs 220 and 230. The upper inter-wire insulating layer 310 may include an etch stop film 312 and an inter-wire insulating film 314. The upper contact hole 310H may penetrate through each of, or at least one of, the inter-wire insulating film 314 and the etch stop film 312 and expose the lower contact plugs 220 and 230. The plug cover layer 230 may be exposed at a bottom surface of the upper contact hole 310H. In some example embodiments, a portion of the lower barrier layer 222 and/or the lower inter-wire insulating layer 210 may be further exposed at the bottom surface of the upper contact hole 310H.

An upper contact plug 320 electrically connected to the lower contact plugs 220 and 230 may be formed in the upper contact hole 310H. The upper contact plug 320 may fill the upper contact hole 310H.

The upper contact plug 320 may include an upper barrier layer 322 covering inner side and bottom surfaces of the upper contact hole 310H, and an upper plug layer 326 filling the upper contact hole 310H. In some example embodiments, a linear cover layer 324 may be formed between the upper barrier layer 322 and the upper plug layer 326.

The upper cover layer 230T may be disposed between the upper contact plug 320 and the lower plug layer 224. Accordingly, the upper contact plug 320 and the lower plug layer 224 may not directly contact each other due to the upper cover layer 230T.

The semiconductor device 1000 includes the plug cover layer 230 filling the recess portion 220R and the gap portion 220G. Accordingly, even when a seam is generated inside the lower plug layer 224 while forming the lower plug layer 224, the gap cover layer 230S of the plug cover layer 230 may fill a portion corresponding to the seam, and thus generation of a void may be reduced or prevented in the lower plug layer 224 due to the seam, or moisture and/or impurities may be reduced or prevented from remaining in the seam. Also, a portion of the lower plug layer 224 may not be exposed while forming the upper barrier layer 322 as the upper cover layer 230T of the plug cover layer 230 is formed over the lower plug layer 224. Accordingly, oxidation of the portion of the lower plug layer 224 is reduced or prevented while forming the upper barrier layer 322, thereby reducing an electric resistance between the upper contact plug 320 and the lower contact plugs 220 and 230 and increasing reliability of an electric connection.

FIGS. 2 through 10 are cross-sectional views for describing a method of manufacturing a semiconductor device 1, according to an example embodiment. Repeated descriptions provided above with reference to FIG. 1 are not provided again.

Figure 2:
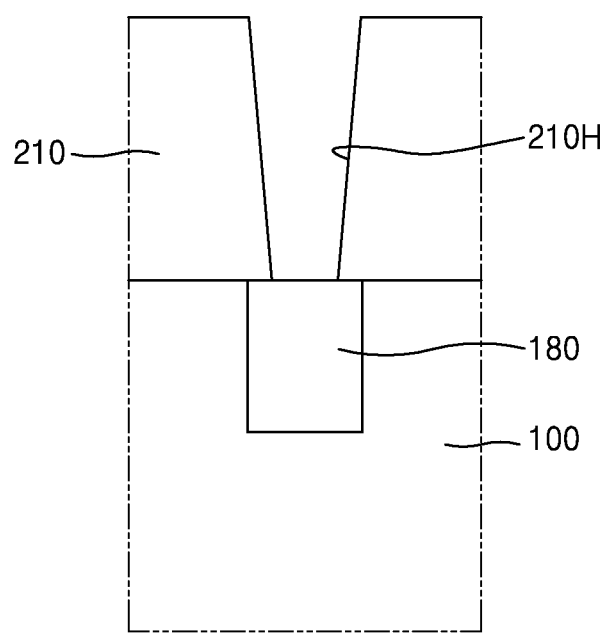
FIGS. 2 through 10 are cross-sectional views for describing a method of manufacturing a semiconductor device, according to an example embodiment.

Referring to FIG. 2, the lower inter-wire insulating layer 210 including the lower contact hole 210H is formed over a base substrate 100 including a connection target layer 180.

In some example embodiments, the connection target layer 180 may be a conductive region formed in a semiconductor substrate, or may be a conductive wire or conductive plug provided on a semiconductor substrate. In other words, the connection target layer 180 may correspond to all portions having conductivity so as to be electrically connected to the lower contact plugs 220 and 230 of FIG. 10. The base substrate 100 may include a semiconductor substrate or may include a semiconductor substrate and an insulating layer formed over the semiconductor substrate to surround the connection target layer 180.

The connection target layer 180 may be exposed at the bottom surface of the lower contact hole 210H. In some example embodiments, the lower contact hole 210H may have the bottom surface lower than a top surface of the base substrate 100, or may have a portion penetrating into the connection target layer 180.

In some example embodiments, the connection target layer 180 may be the gate electrode 150 shown in FIG. 1, and a portion of the base substrate 100 may be the substrate 110 of FIG. 1.

Figure 3:
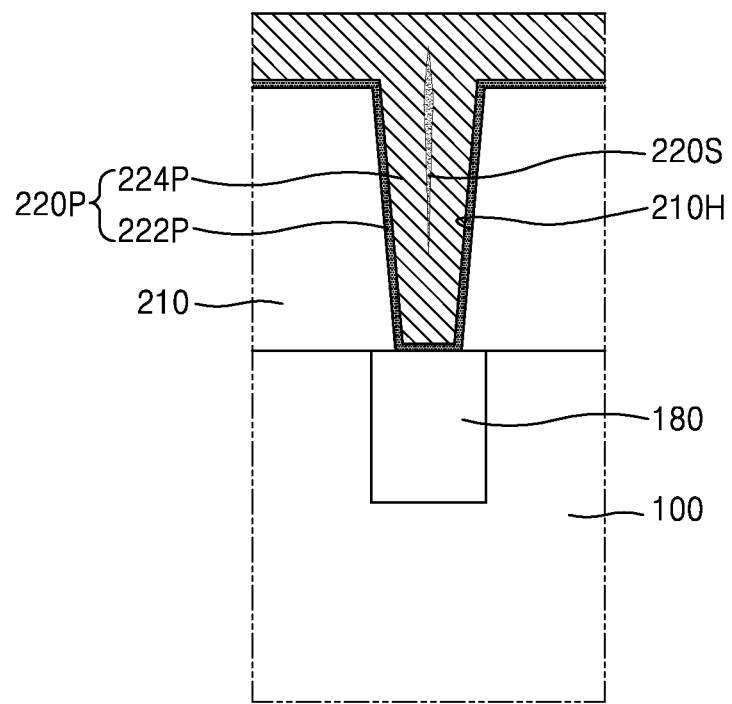

Referring to FIG. 3, a preliminary lower barrier layer 222P covering inner side and bottom surfaces of the lower contact hole 210H, and a preliminary lower plug layer 224P covering the preliminary lower barrier layer 222P and filling the lower contact hole 210H are formed. The preliminary lower barrier layer 222P may be conformally formed to cover the top surface of the lower inter-wire insulating layer 210, and also the inner side and bottom surfaces of the lower contact hole 210H. In some example embodiments, the preliminary lower barrier layer 222P may be formed of or include nitride or oxide of a metal, such as Ti, Ta, Ru, Mn, Co, or W. In some example embodiments, the preliminary lower barrier layer 222P may be formed of or include an alloy, such as CoWP, CoWB, or CoWBP.

The preliminary lower plug layer 224P fills the entire lower contact hole 210H, and may cover the preliminary lower barrier layer 222P formed over the top surface of the lower inter-wire insulating layer 210. The preliminary lower plug layer 224P may be formed of or include a metal material, such as W, Cu, Ti, Ta, Ru, Mn, or Co.

The preliminary lower barrier layer 222P and the preliminary lower plug layer 224P may be formed, for example, by a CVD or ALD process.

A seam 220S extending in a height direction of the preliminary lower plug layer 224P may be formed inside the preliminary lower plug layer 224P. The seam 220S may be formed as opposite portions of the preliminary lower plug layer 224P contact each other while the preliminary lower plug layer 224P is formed over the preliminary lower barrier layer 222P. The seam 220S may be an interface formed between the portions of the preliminary lower plug layer 224P. In some example embodiments, there may be moisture or impurities generated while forming the preliminary lower plug layer 224P in the seam 220S.

Figure 4:
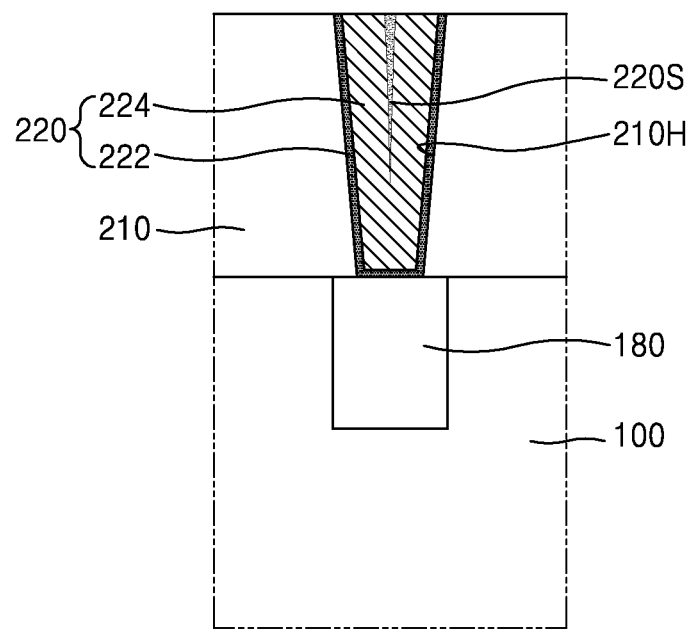

Referring to FIG. 4, a portion of the preliminary lower plug layer 224P of FIG. 3 and a portion of the preliminary lower barrier layer 222P of FIG. 3 are removed such that the top surface of the lower inter-wire insulating layer 210 is exposed, thereby forming the plug base layer 220 including the lower barrier layer 222 covering the side and bottom surfaces of the lower contact hole 210H and the lower plug layer 224 formed over the lower barrier layer 222 to fill the lower contact hole 210H.

The seam 220S may be provided inside the plug base layer 220. In some example embodiments, the seam 220S may be exposed at the top surface of the plug base layer 220.

In order to form the plug base layer 220, the portion of the preliminary lower plug layer 224P and the portion of the preliminary lower barrier layer 222P may be removed by performing a CMP process or an etch-back process.

Figure 5:
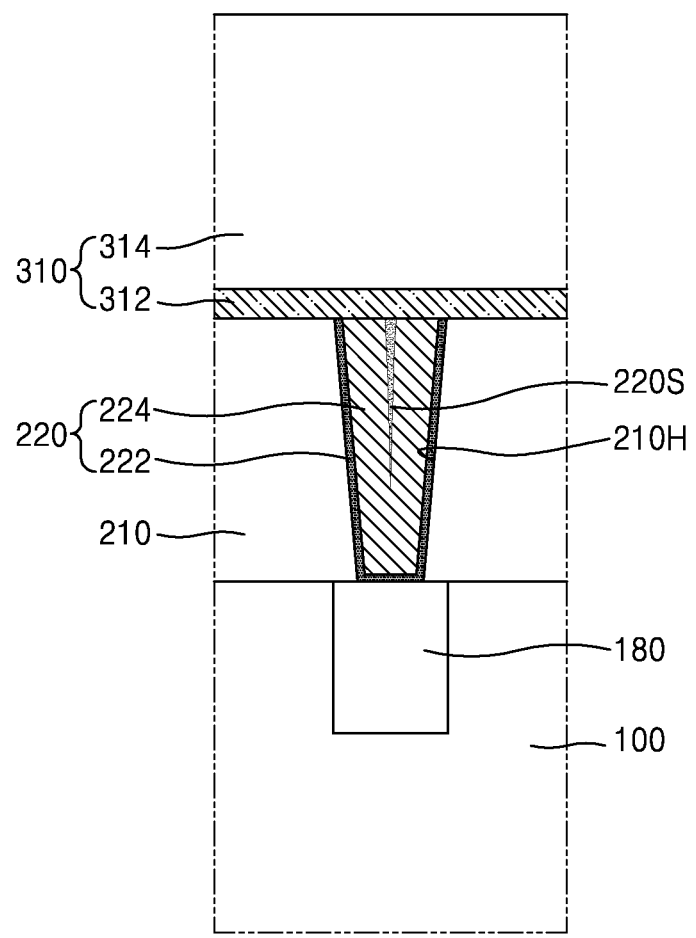

Referring to FIG. 5, the upper inter-wire insulating layer 310 including the etch stop film 312 and the inter-wire insulating film 314 may be formed over the lower inter-wire insulating layer 210 where the plug base layer 220 is formed. The etch stop film 312 may cover the plug base layer 220 and the top surface of the lower inter-wire insulating layer 210, and the inter-wire insulating film 314 may cover the etch stop film 312. In some example embodiments, the etch stop film 312 may be formed of or include nitride and the inter-wire insulating film 314 may be formed of or include oxide.

Figure 6:
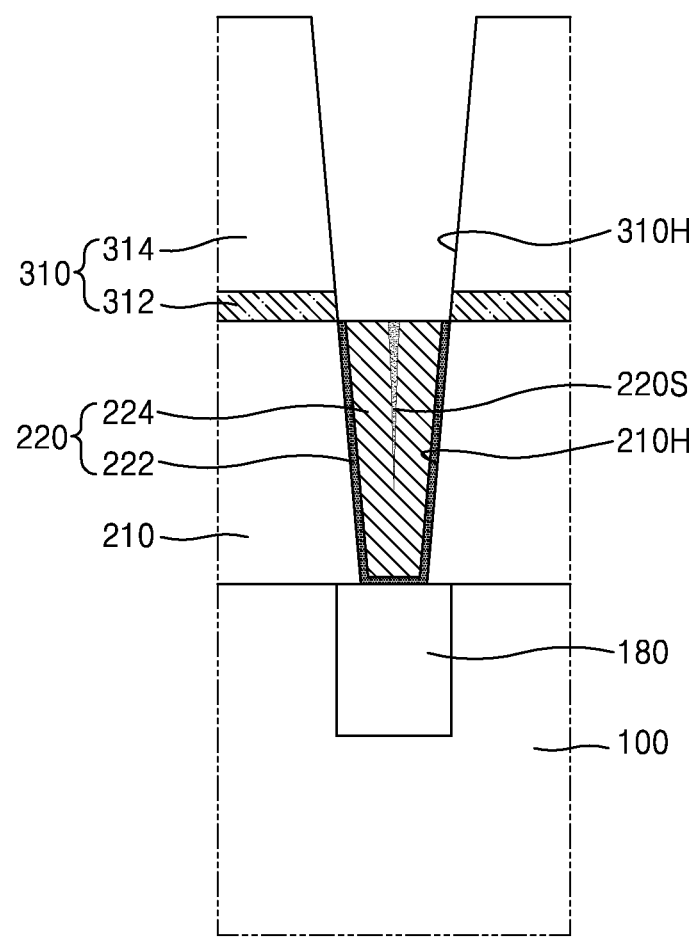

Referring to FIG. 6, a portion of the upper inter-wire insulating layer 310 is removed such that the plug base layer 220 is exposed, thereby forming the upper contact hole 310H penetrating through the upper inter-wire insulating layer 310. The upper contact hole 310H may be formed by removing a portion of the etch stop film 312 so that the plug base layer 220 is exposed, after removing a portion of the inter-wire insulating film 314 so that the etch stop film 312 is exposed. In some example embodiments, a dry etch method may be performed to remove the portion of the inter-wire insulating film 314, and a wet etch method may be performed to remove the portion of the etch stop film 312. In some example embodiments, the portion of the inter-wire insulating film 314 and the portion of the etch stop film 312 may each be removed by a dry etch method.

In some example embodiments, while removing the portion of the etch stop film 312, lateral loss, in which a portion of the etch stop film 312 located at a lower portion of the inter-wire insulating film 314 is also partially removed, may be generated.

Figure 7:
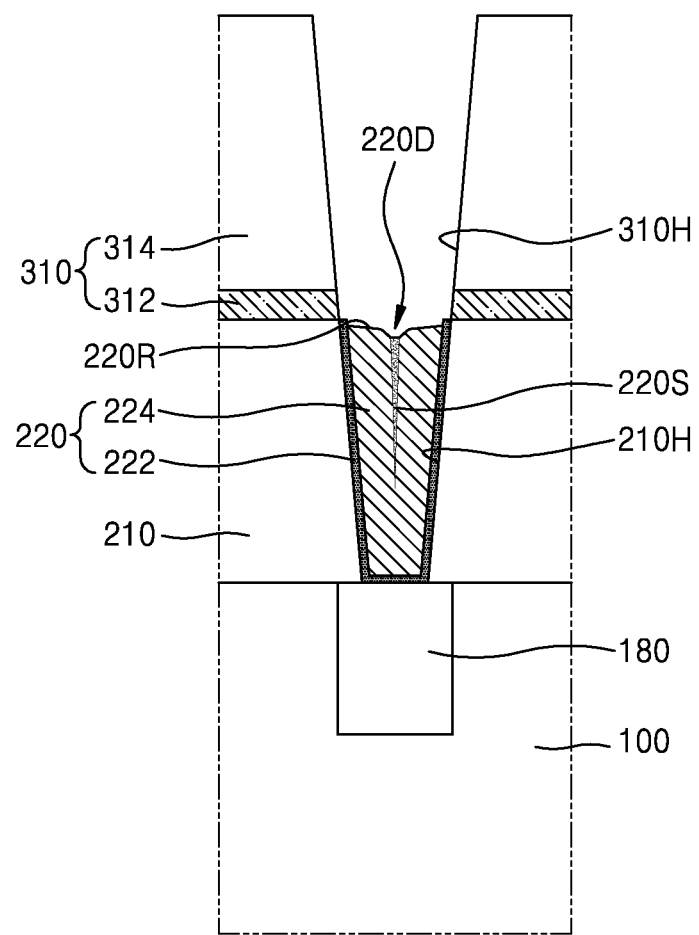

Referring to FIG. 7, an upper portion of the plug base layer 220 exposed through the upper contact hole 310H is removed. In some example embodiments, the uppermost portion of the lower plug layer 224 is set to be at a level lower than the uppermost portion of the lower barrier layer 222 by using a removing method having etch selectivity between the lower barrier layer 222 and the lower plug layer 224, thereby exposing a side surface of the upper portion of the lower barrier layer 222. Accordingly, the recess portion 220R limited by the side surface of the upper portion of the lower barrier layer 222 and the top surface of the lower plug layer 224 may be formed at the upper portion of the lower contact hole 210H. A first dimple 220D having a concave portion near the seam 220S may be formed at the top surface of the lower plug layer 224 when a portion of the seam 220S is relatively largely removed while removing the upper portion of the lower plug layer 224. A cross-section of an upper portion of the seam 220S may be largely extended by the first dimple 220D.

In order to form the recess portion 220R, an etch-back process may be performed. The etch-back process may be performed using CO, $O_2$, $N_2$, or Ar gas.

In some example embodiments, the recess portion 220R and/or the first dimple 220D may be formed while forming the upper contact hole 310H.

Figure 8:
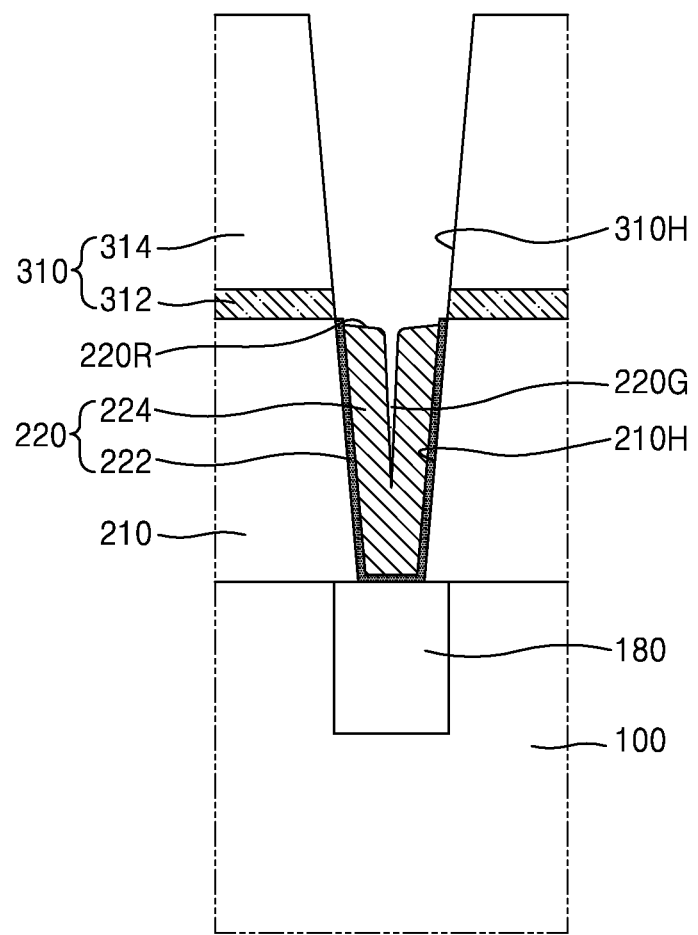

Referring to FIG. 8, the gap portion 220G communicating with the recess portion 220R is formed at a location corresponding to the seam 220S by performing a cleaning process for removing the moisture or impurities in the seam 220S of FIG. 7. In some example embodiments, the cleaning process may be performed by an $H_2$ plasma process.

In some example embodiments, since the gap portion 220G is formed by performing the cleaning process on the seam 220S through the first dimple 220D of FIG. 7, the gap portion 220G may have a relatively large width compared to the seam 220S.

Figure 9:
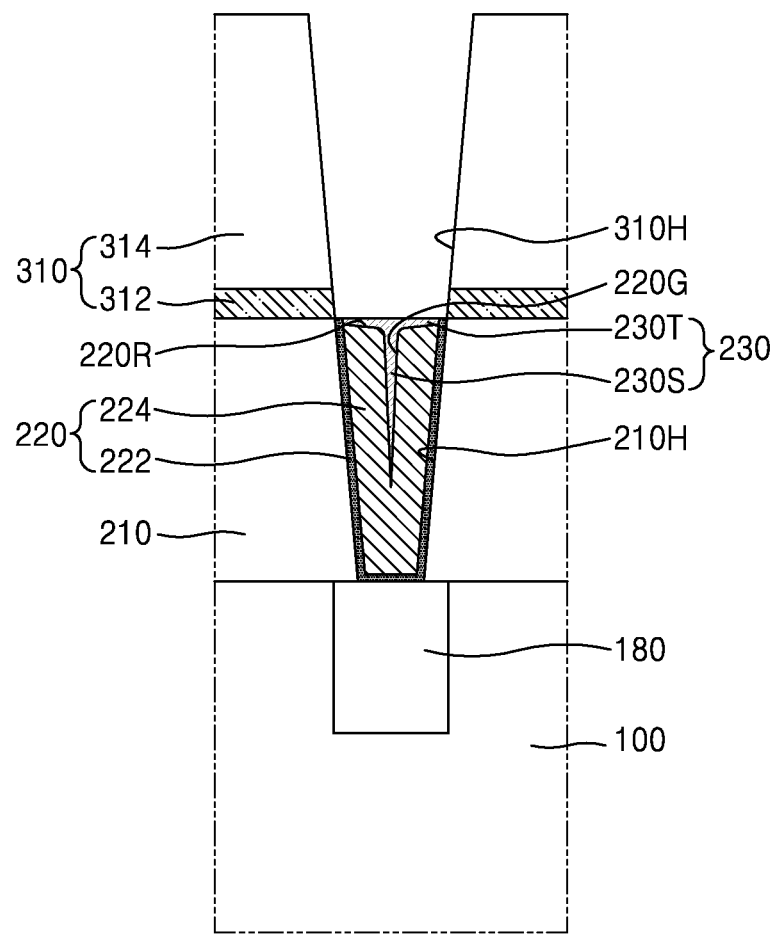

Referring to FIG. 9, the plug cover layer 230 is formed over a surface of the lower plug layer 224 exposed through the upper contact hole 310H. In some example embodiments, the plug cover layer 230 may not be formed over the surface of the lower barrier layer 222, but may be selectively formed over the surface of the lower plug layer 224. For example, when the lower barrier layer 222 is formed of or include nitride and the lower plug layer 224 is formed of or include a metal material, the plug cover layer 230 may not be formed over the nitride but may be only formed over the metal material. In this case, the plug cover layer 230 may not be formed over the top surface of the uppermost portion of the lower barrier layer 222.

The plug cover layer 230 may include the gap cover layer 230S filling the gap portion 220G and the upper cover layer 230T filling the recess portion 220R. The upper cover layer 230T and the gap cover layer 230S may be integrally formed. The plug cover layer 230 may be formed of or include a metal, such as W, Ti, Ta, Ru, Mn, or Co. The gap cover layer 230S of the plug cover layer 230 may fill the entire gap portion 220G such that a void does not exist in the lower plug layer 224. The upper cover layer 230T of the plug cover layer 230 may cover the entire top surface of the lower plug layer 224 such that the lower plug layer 224 is not exposed through the upper contact hole 310H. In other words, the plug cover layer 230 may cover the entire surface of the plug base layer 220 exposed through the upper contact hole 310H.

Figure 10:
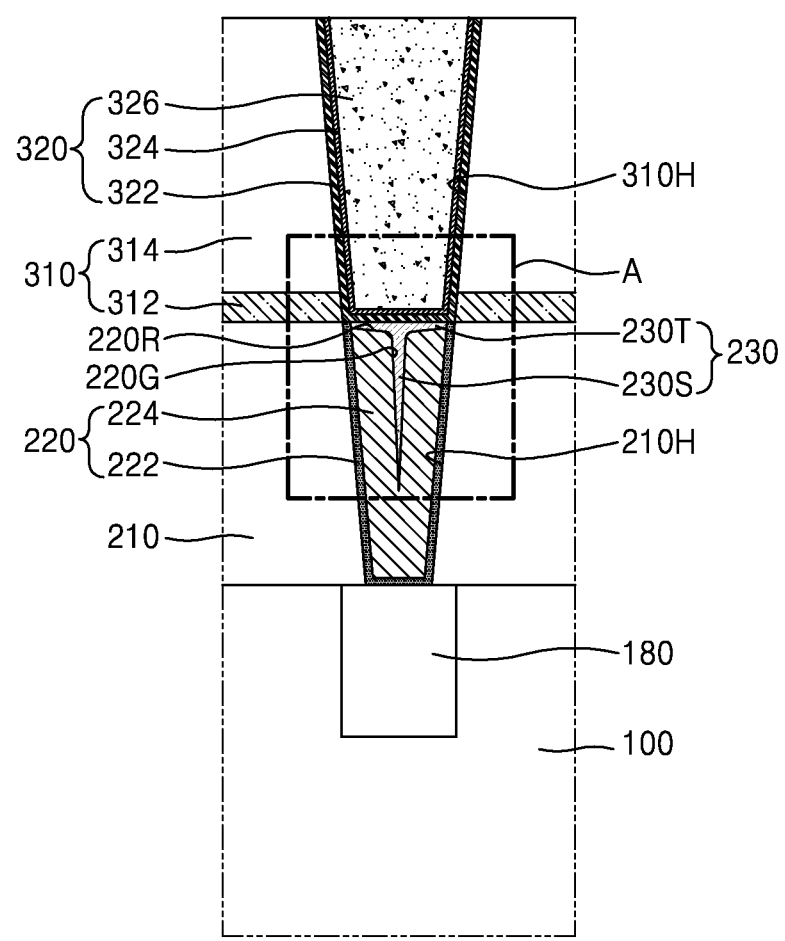

Referring to FIG. 10, the upper contact plug 320 is formed inside the upper contact hole 310H and electrically connected to the lower contact plugs 220 and 230. In some example embodiments, the upper contact plug 320 may be formed by a damascene process. In some example embodiments, the upper contact plug 320 may be formed by a single damascene process. In some example embodiments, the upper contact plug 320 may be a contact plug portion from among a wire and a contact plug, which are formed together by a dual damascene process.

The upper contact plug 320 may include the upper barrier layer 322 covering the inner side and bottom surfaces of the upper contact hole 310H, and the upper plug layer 326 filling the upper contact hole 310H. In some example embodiments, the linear cover layer 324 may be formed between the upper barrier layer 322 and the upper plug layer 326.

In some example embodiments, the upper barrier layer 322 may be formed of or include nitride or oxide of a metal, such as Ti, Ta, Co, Ru, Mn, or W. In some example embodiments, the upper plug layer 326 may be formed of or include a metal material, such as W or Cu, or an alloy including the metal material. In some example embodiments, the linear cover layer 324 may be formed of or include a metal material, such as Co, Ru, or Mn.

The semiconductor device 1 includes the plug cover layer 230. The gap cover layer 230S of the plug cover layer 230 may fill the gap portion 220G corresponding to the seam 220S of FIG. 4 in order to reduce or prevent generation of a void in the lower plug layer 224 due to the seam 220S or to reduce or prevent moisture and/or impurities from remaining in the seam 220S, even when the seam 220S is generated in the lower plug layer 224 while forming the lower plug layer 224.

Since the surface of the lower plug layer 224 exposed through the upper contact hole 310H is covered by the plug cover layer 230, in particular, by the upper cover layer 230T, oxidation of a portion of the lower plug layer 224 may be reduced or prevented while the upper contact plug 320, in particular, the upper barrier layer 322, is formed.

Accordingly, an electric resistance between the upper contact plug 320 and the lower contact plugs 220 and 230 may be reduced, and reliability of an electric connection may be increased.

FIGS. 11A through 11I are cross-sectional views of semiconductor devices 1a through 1i according to embodiments. In detail, FIGS. 11A through 11I are enlarged cross-sectional views of aspects of the semiconductor devices 1a through 1i according to embodiments, which are obtained by enlarging a region A of FIG. 10. Descriptions provided with reference to FIGS. 11A through 11I, which are the same as those of FIG. 1 through 10, are not provided again.

Figure 11A:
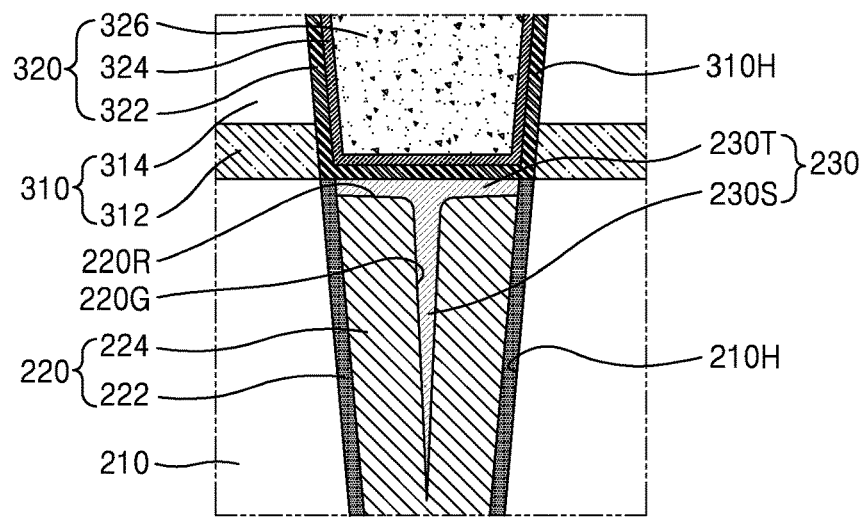
FIGS. 11A through 11I are cross-sectional views of semiconductor devices according to example embodiments.

Referring to FIG. 11A, the semiconductor device 1a includes the lower contact plugs 220 and 230 and the upper contact plug 320 formed over the lower contact plugs 220 and 230 and electrically connected to the lower contact plugs 220 and 230. The lower contact plugs 220 and 230 may fill the lower contact hole 210H, and the upper contact plug 320 may fill the upper contact hole 310H.

The lower contact plugs 220 and 230 may include the plug base layer 220 and the plug cover layer 230 formed over the plug base layer 220. The plug base layer 220 may include the lower barrier layer 222 and the lower plug layer 224.

The lower plug layer 224 may be formed over the lower barrier layer 222 to limit the gap portion 220G at the center the lower plug layer 224. The uppermost portion of the lower plug layer 224 may be located at a level lower than the uppermost portion of the lower barrier layer 222. The recess portion 220R communicating with the gap portion 220G may be limited between the uppermost portion of the lower barrier layer 222 and the top surface of the lower plug layer 224.

The plug cover layer 230 may include the gap cover layer 230S filling the gap portion 220G, and the upper cover layer 230T filling the recess portion 220R.

Before the plug cover layer 230 is formed, at least a portion of the top surface of the lower barrier layer 222, and the top surface of the lower plug layer 224 may be exposed at the bottom surface of the upper contact hole 310H after the upper contact hole 310H is formed. Then, when the plug cover layer 230 is selectively formed over the surface of the lower plug layer 224, the plug cover layer 230 may not be formed over the top surface of the uppermost portion of the lower barrier layer 222. Accordingly, the at least a portion of the top surface of the lower barrier layer 222, and the top surface of the plug cover layer 230 may be exposed at the bottom surface of the upper contact hole 310H.

Then, when the upper contact plug 320 filling the upper contact hole 310H is formed, the lower surface of the upper contact plug 320 may contact the at least a portion of the top surface of the lower barrier layer 222, and the top surface of the plug cover layer 230. In other words, the at least a portion of the top surface of the lower barrier layer 222, and the top surface of the plug cover layer 230, which are located at the bottom surface of the upper contact hole 310H, may contact the upper barrier layer 322.

Accordingly, oxidation of a portion of the lower plug layer 224 is reduced or prevented while the upper barrier layer 322 is formed, thereby reducing an electric resistance between the upper contact plug 320 and the lower contact plugs 220 and 230.

Figure 11B:
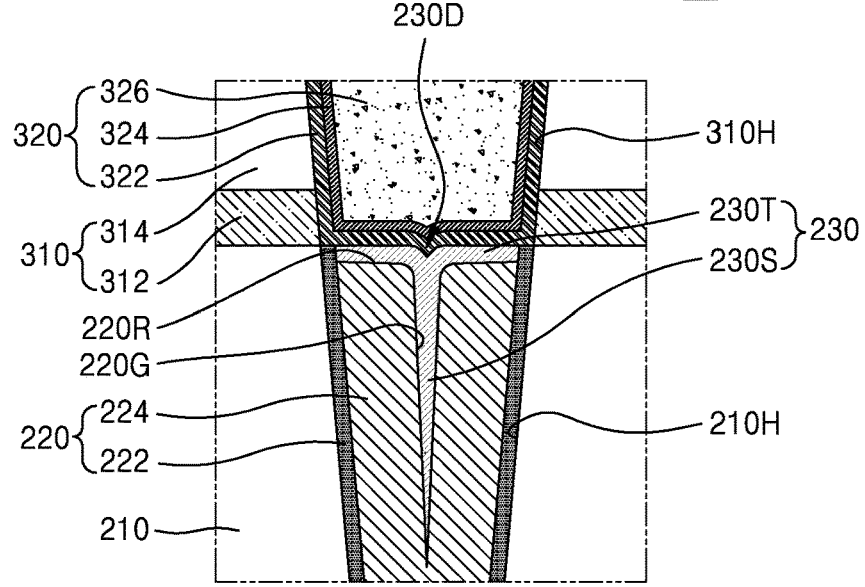

Referring to FIG. 11B, the semiconductor device 1b includes the lower contact plugs 220 and 230, and the upper contact plug 320 formed over the lower contact plugs 220 and 230 and electrically connected to the lower contact plugs 220 and 230.

The top surface of the plug cover layer 230, i.e., the top surface of the upper cover layer 230T, may include a second dimple 230D having a concave shape at the upper portion of the gap cover layer 230S. When the second dimple 230D is enlarged at a cross-section of an upper portion of the seam 220S of FIG. 7 by the first dimple 220D of FIG. 7, a cross-section of an upper portion of the gap portion 220G of FIG. 8 may also be relatively largely formed compared to a cross-section of a lower portion of the gap portion. Since the plug cover layer 230 is selectively formed over the surface of the lower plug layer 224, a shape of the gap portion 220G having the larger cross-section of the upper portion of the gap portion 220G may be transferred onto the top surface of the plug cover layer 230, thereby forming the second dimple 230D. In some example embodiments, the second dimple 230D may also be transferred onto each of, or at least one of, the top surfaces of the upper barrier layer 322 and the linear cover layer 324.

Figure 11C:
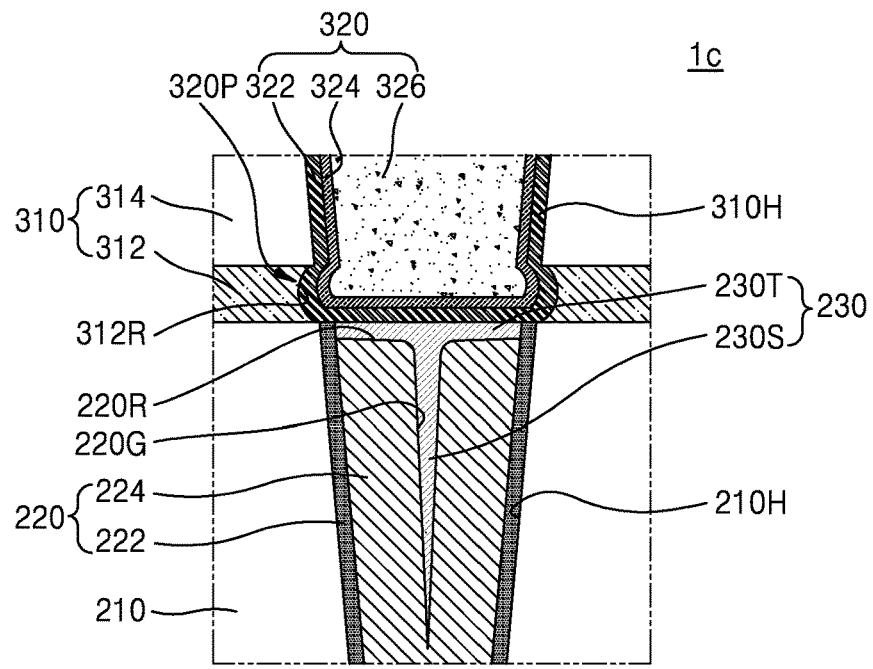

Referring to FIG. 11C, the semiconductor device 1c includes the lower contact plugs 220 and 230, and the upper contact plug 320 formed over the lower contact plugs 220 and 230 and electrically connected to the lower contact plugs 220 and 230.

While removing a portion of the etch stop film 312 so as to expose the lower contact plugs 220 and 230, lateral loss, in which a portion of the etch stop film 312, which is located below the inter-wire insulating film 314, is also removed, may be generated, and thus a horizontal recess portion 312R may be formed at a portion of the etch stop film 312 below the upper contact hole 310H. Accordingly, the upper contact plug 320 may have a protruding portion 320P filling the horizontal recess portion 312R. In other words, the upper contact plug 320 may have the protruding portion 320P at a lower portion of a side surface the upper contact plug 320.

Figure 11D:
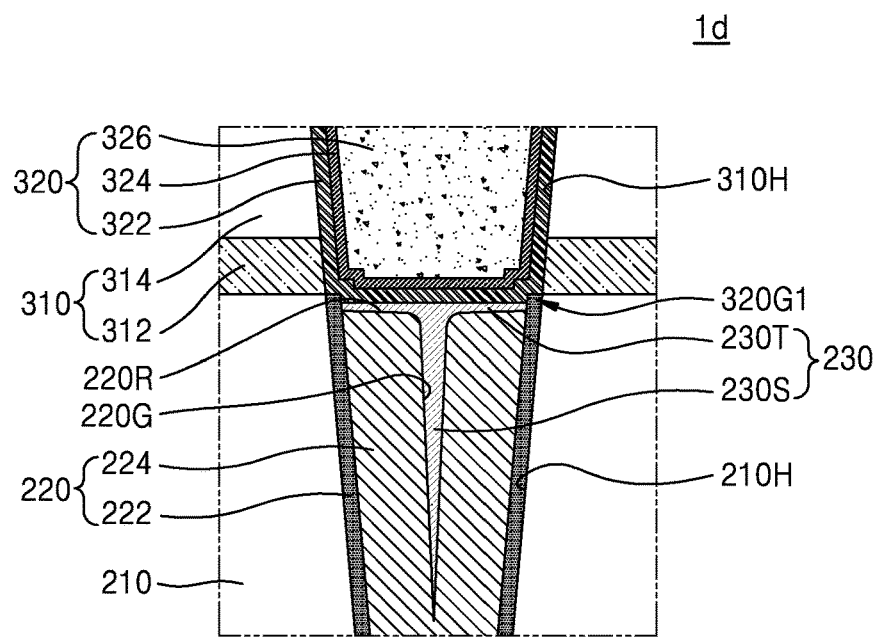

Referring to FIG. 11D, the semiconductor device 1d includes the lower contact plugs 220 and 230, and the upper contact plug 320 formed over the lower contact plugs 220 and 230 and electrically connected to the lower contact plugs 220 and 230.

The uppermost surface of the plug cover layer 230 may be located at a level lower than the top surface of the uppermost portion of the lower barrier layer 222. The entire surface of the lower plug layer 224 may be covered by the plug cover layer 230 even when the uppermost surface of the upper cover layer 230T, which is also formed while the gap cover layer 230S is formed to fill the entire gap portion 220G, is located at a level lower than the top surface of the uppermost portion of the lower barrier layer 222.

Accordingly, the upper portion of the lower barrier layer 222 may protrude further than the uppermost surface of the plug cover layer 230, i.e., the uppermost surface of the upper cover layer 230T. A groove portion 320G1 corresponding to the protruding upper portion of the lower barrier layer 222 may be formed at a portion adjacent to an edge of the lower surface of the upper contact plug 320.

Figure 11E:
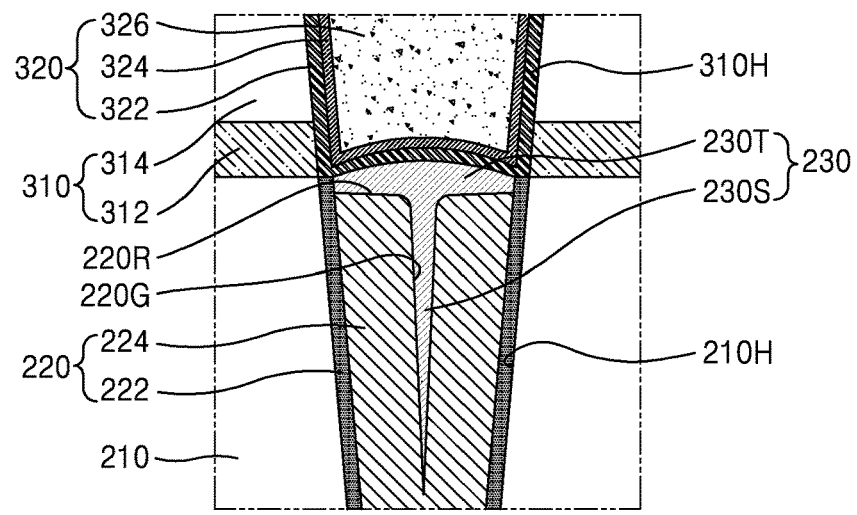

Referring to FIG. 11E, the semiconductor device 1e includes the lower contact plugs 220 and 230, and the upper contact plug 320 formed over the lower contact plugs 220 and 230 and electrically connected to the lower contact plugs 220 and 230.

The uppermost portion of the plug cover layer 230 may be located at a level higher than the top surface of the uppermost portion of the lower barrier layer 222. At least a portion of the top surface of the uppermost portion of the lower barrier layer 222 may not be covered by the plug cover layer 230 even when the uppermost portion of the upper cover layer 230T, which is also formed while the gap cover layer 230S is formed to fill the entire gap portion 230G, is located at a level higher than the top surface of the uppermost portion of the lower barrier layer 222. The top surface of the plug cover layer 230 may have a shape protruding upward.

Figure 11F:
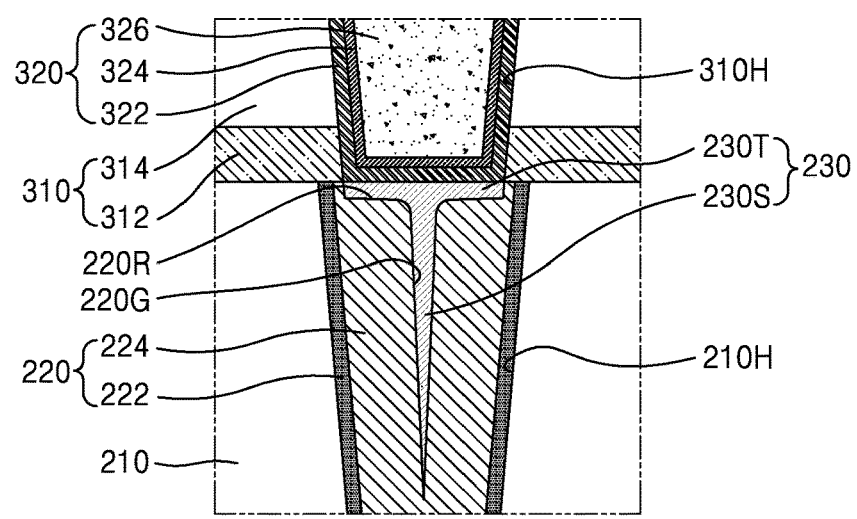

Referring to FIG. 11F, the semiconductor device 1f includes the lower contact plugs 220 and 230, and the upper contact plug 320 formed over the lower contact plugs 220 and 230 and electrically connected to the lower contact plugs 220 and 230.

In some example embodiments, a width of a lowermost portion of the upper contact hole 310H may be narrower than a width of the uppermost portion of the lower contact hole 210H. In this case, before the plug cover layer 230 is formed, at least a portion of the top surface of the lower plug layer 224 may not be exposed at the bottom surface of the upper contact hole 310H.

In other words, a portion of the top surface of the lower plug layer 224, which does not overlap the lower surface of the upper contact plug 320, may be covered by the etch stop film 312. In this case, the plug cover layer 230 may not be formed over at least a portion of the portion of the top surface of the lower plug layer 224, which does not overlap the lower surface of the upper contact plug 320.

Figure 11G:
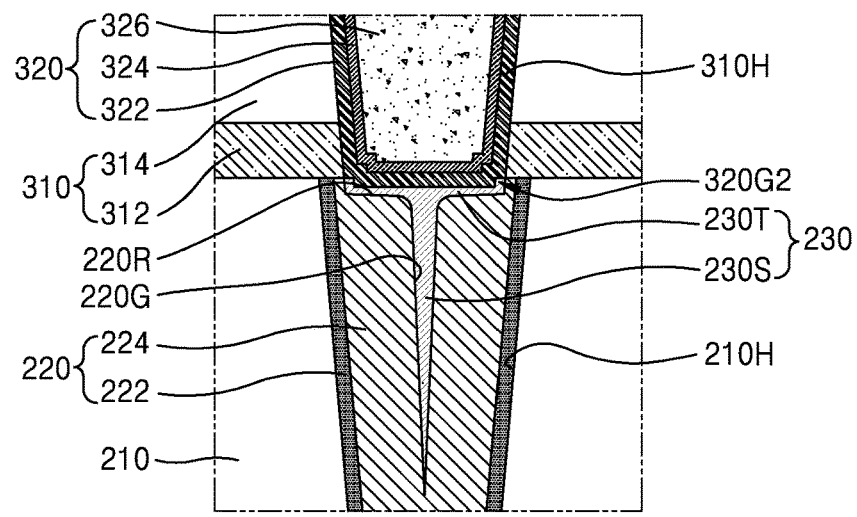

Referring to FIG. 11G, the semiconductor device 1g includes the lower contact plugs 220 and 230, and the upper contact plug 320 formed over the lower contact plugs 220 and 230 and electrically connected to the lower contact plugs 220 and 230.

In some example embodiments, the width of the lowermost portion of the upper contact hole 310H may be narrower than the width of the uppermost portion of the lower contact hole 210H. In this case, before the plug cover layer 230 is formed, at least a portion of the top surface of the lower plug layer 224 may not be exposed at a bottom surface of the upper contact hole 310H.

When the upper cover layer 230T is formed to be relatively thin, a portion of the top surface of the upper cover layer 230T may have a level lower than the remaining of the top surface of the upper cover layer 230T. In other words, the upper cover layer 230T may have a protruding portion at the top thereof. Accordingly, a groove portion 320G2 corresponding to the protruding portion of the upper cover layer 230T may be formed at a portion of the lower surface of the upper contact plug 320.

Figure 11H:
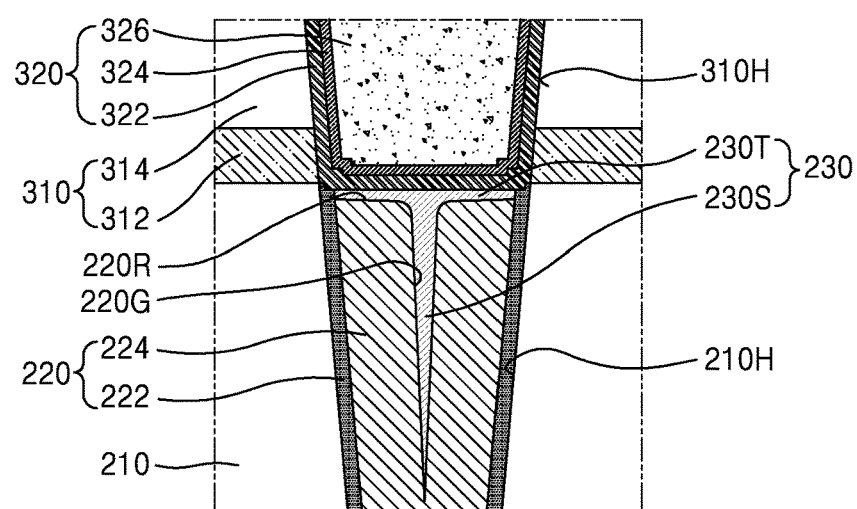

Referring to FIG. 11H, the semiconductor device 1h includes the lower contact plugs 220 and 230, and the upper contact plug 320 formed over the lower contact plugs 220 and 230 and electrically connected to the lower contact plugs 220 and 230.

While the upper contact hole 310H is formed, a bottom surface of the upper contact hole 310H may have a level lower than a top surface of the lower inter-wire insulating layer 210. In this case, a lower surface of the upper contact plug 320 may have a level lower than the top surface of the lower inter-wire insulating layer 210.

Figure 11I:
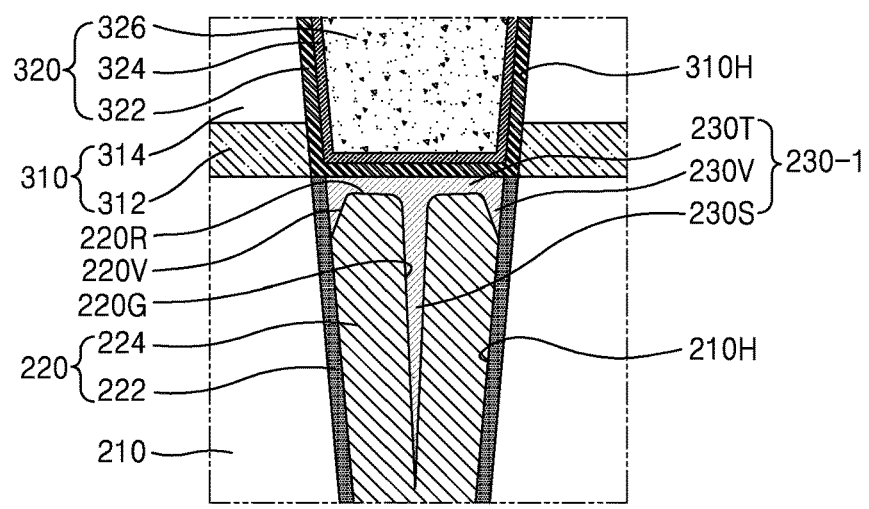

Referring to FIG. 11I, the semiconductor device 1i includes lower contact plugs 220 and 230-1, and the upper contact plug 320 formed over the lower contact plugs 220 and 230-1 and electrically connected to the lower contact plugs 220 and 230-1.

The lower contact plugs 220 and 230-1 may include the plug base layer 220 and a plug cover layer 230-1 formed over the plug base layer 220.

While the plug base layer 220 is formed as described above with reference to FIG. 4, a slit void 220V extending from the top portion of the plug base layer 220 along a portion between the lower barrier layer 222 and the lower plug layer 224 may be formed.

The slit void 220V may be formed by further removing a portion of the preliminary lower plug layer 224P along an interface between the lower barrier layer 222 and the lower plug layer 224 during a CMP or etch-back process performed to form the plug base layer 220.

The plug cover layer 230-1 may include the gap cover layer 230S filling the gap portion 220G, the upper cover layer 230T filling the recess portion 220R, and a slit cover layer 230V filling the slit void 220V. The upper cover layer 230T, the gap cover layer 230S, and the slit cover layer 230V may be integrally formed.

Figure 12:
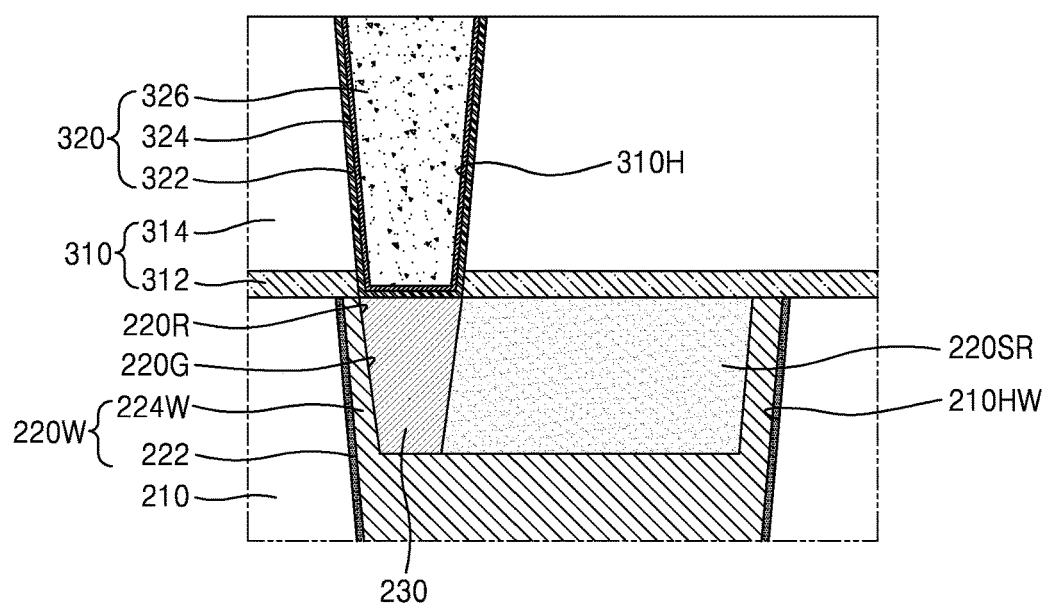
FIG. 12 is a cross-sectional view of a semiconductor device according to another example embodiment.

FIG. 12 is a cross-sectional view of a semiconductor device 2 according to another example embodiment.

Referring to FIG. 12, the semiconductor device 2 includes the lower contact plugs 220 and 230 filling a lower contact hole 210HW, and the upper contact plug 320 formed over the lower contact plugs 220 and 230 and filling the upper contact hole 310H to be electrically connected to the lower contact plugs 220 and 230.

In some example embodiments, FIG. 12 may be a cross-sectional view taken in a direction different from those of FIGS. 11A through 11I. For example, the semiconductor device 2 of FIG. 12 may be taken in a direction different from the semiconductor devices 1a through 1i of FIGS. 11A through 11I, based on the plug cover layers 230 and 230-1.

The lower contact hole 210HW may have a relatively wide width compared to the upper contact hole 310H. In this case, while the gap portion 220G of FIG. 8 is formed after the upper contact hole 310H is formed, a cleaning process may not affect a portion of the seam 220S of FIG. 8. Accordingly, the portion of the seam 220S may be left as a remaining seam 220SR. In detail, the gap portion 220G is formed at a portion of the seam 220S and an adjacent portion, which overlap the bottom surface of the upper contact hole 310H, i.e., the lower surface of the upper contact plug 320, and a portion of the plug cover layer 230 (i.e., the gap cover layer 230S of FIGS. 11A through 11I) may be formed at the gap portion 220G, but a portion of the seam 220S may be left as the remaining seam 220SR inside the lower plug layer 224 spaced apart from a portion overlapping the upper contact plug 320. The remaining seam 220SR may contact the plug cover layer 230.

However, since the plug cover layer 230 is formed at a portion overlapping the lower surface of the upper contact plug 320, moisture or impurities in the remaining seam 220SR may not affect reliability of an electric connection between the upper contact plug 320 and the lower contact plugs 220 and 230.

Figure 13:
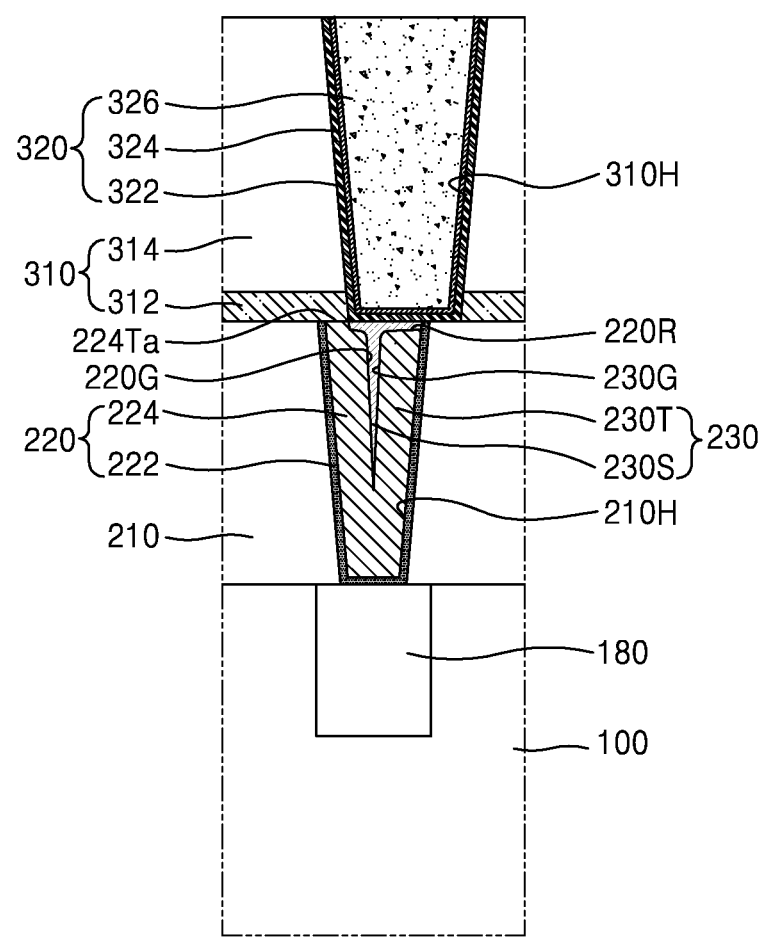
FIG. 13 is a cross-sectional view of a semiconductor device according to another example embodiment.

FIG. 13 is a cross-sectional view of a semiconductor device 3 according to another example embodiment.

Referring to FIG. 13, the semiconductor device 3 includes the lower contact plugs 220 and 230 filling the lower contact hole 210H, and the upper contact plug 320 formed over the lower contact plugs 220 and 230 and filling the upper contact hole 310H to be electrically connected to the lower contact plugs 220 and 230.

The upper contact hole 310H and the lower contact hole 210H communicate with each other, but a portion of the bottom surface of the upper contact hole 310H and a portion of the upper portion of the lower contact hole 210H may not overlap each other. In other words, the upper contact hole 310H and the lower contact hole 210H may be misaligned.

A portion 224Ta of the top surface of the lower plug layer 224, which does not overlap the bottom surface of the upper contact hole 310H, i.e., the portion 224Ta of the top surface of the lower plug layer 224, which does not overlap the lower surface of the upper contact plug 320, may be covered by the etch stop film 312. In this case, the plug cover layer 230 may not be formed over at least a portion of the portion 224Ta of the top surface of the lower plug layer 224, which does not overlap the lower surface of the upper contact plug 320.

The plug cover layer 230 may not be formed over an outer portion of the top surface of the lower plug layer 224 even when the upper contact hole 310H and the lower contact hole 210H are not misaligned, when the width of the bottom surface of the upper contact hole 310H is narrower than the width of the upper portion of the lower contact hole 210H, as shown in FIG. 11F.

As shown in FIG. 13, when the width of the bottom surface of the upper contact hole 310H is similar to or the same as the width of the upper portion of the lower contact hole 210H and the upper contact hole 310H and the lower contact hole 210H are misaligned, the plug cover layer 230 may not be formed over the portion 224Ta of the outer portion of the top surface of the lower plug layer 224, and the plug cover layer 230 may be formed over a remaining portion of the outer portion of the top surface of the lower plug layer 224.

Figure 14:
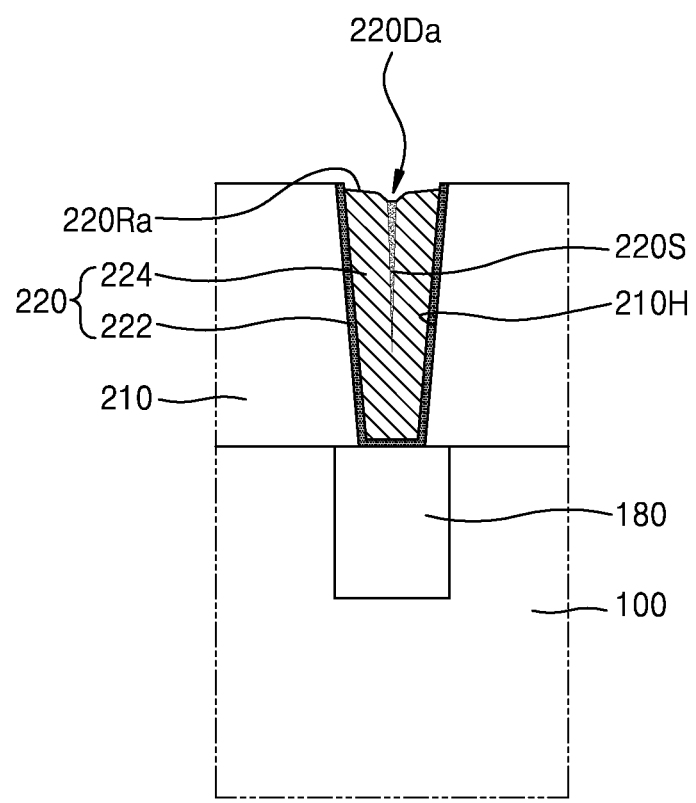
FIGS. 14 through 19 are cross-sectional views for describing a method of manufacturing a semiconductor device, according to another example embodiment.

FIGS. 14 through 19 are cross-sectional views for describing a method of manufacturing a semiconductor device 4, according to another example embodiment. In detail, FIG. 14 shows an operation of the method after FIG. 4.

Referring to FIG. 14, a partial upper portion of the plug base layer 220 is removed. In some example embodiments, a side surface of the partial upper portion of the lower barrier layer 222 may be exposed by locating the uppermost portion of the lower plug layer 224 at a level lower than the uppermost portion of the lower barrier layer 222 by using a removing method having etch selectivity between the lower barrier layer 222 and the lower plug layer 224. Accordingly, a recess portion 220Ra limited by the side surface of the partial upper portion of the lower barrier layer 222 and the top surface of the lower plug layer 224 may be formed at an upper portion of the lower contact hole 210H. While the partial upper portion of the lower plug layer 224 is removed, a portion of the seam 220S may be relatively largely removed, and thus a first dimple 220Da having a concave portion near the seam 220S may be formed at the top surface of the lower plug layer 224. A cross-section of an upper portion of the seam 220S may be enlarged by the first dimple 220Da.

An etch-back process may be performed to form the recess portion 220Ra.

Figure 15:
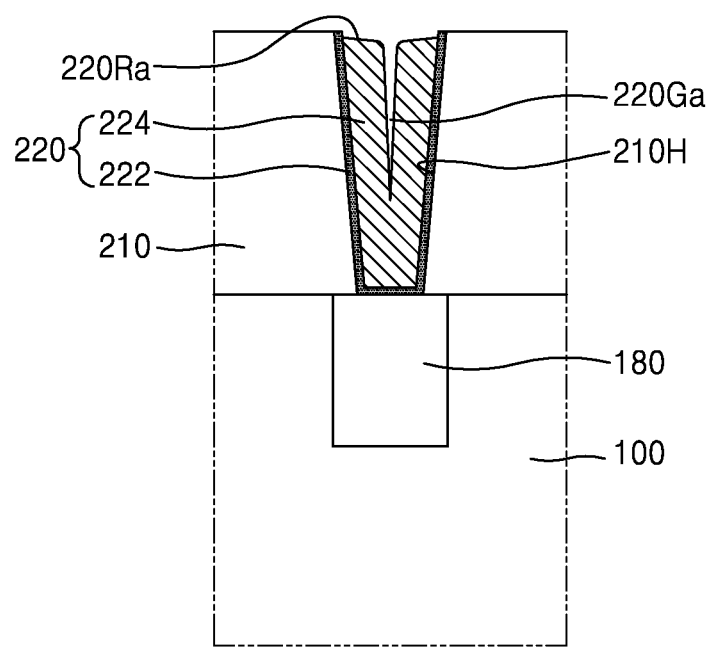

Referring to FIG. 15, a cleaning process is performed to remove moisture or impurities in the seam 220S of FIG. 14, so as to form a gap portion 220Ga communicating with the recess portion 220Ra at a location corresponding to the seam 220S.

Figure 16:
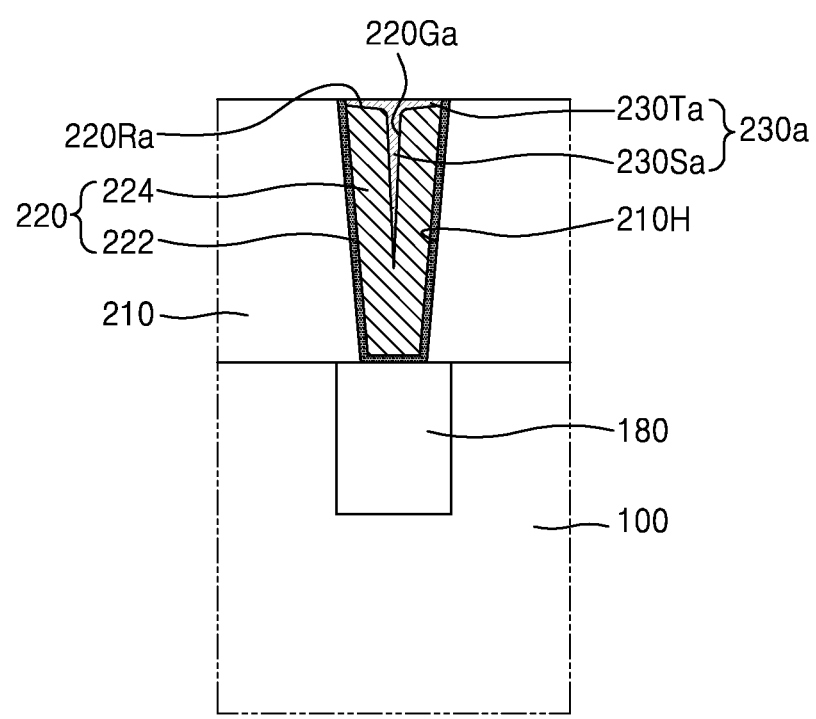

Referring to FIG. 16, a preliminary plug cover layer 230a is formed over a surface of the lower plug layer 224. In some example embodiments, the preliminary plug cover layer 230a may not be formed over the lower barrier layer 222, but may be selectively formed over the surface of the lower plug layer 224. In this case, the preliminary plug cover layer 230a may not be formed over the top surface of the uppermost portion of the lower barrier layer 222.

The preliminary plug cover layer 230a may include a gap cover layer 230Sa filling the gap portion 220Ga, and a preliminary upper cover layer 230Ta filling the recess portion 220Ra. The preliminary upper cover layer 230Ta and the gap cover layer 230Sa may be integrally formed.

Figure 17:
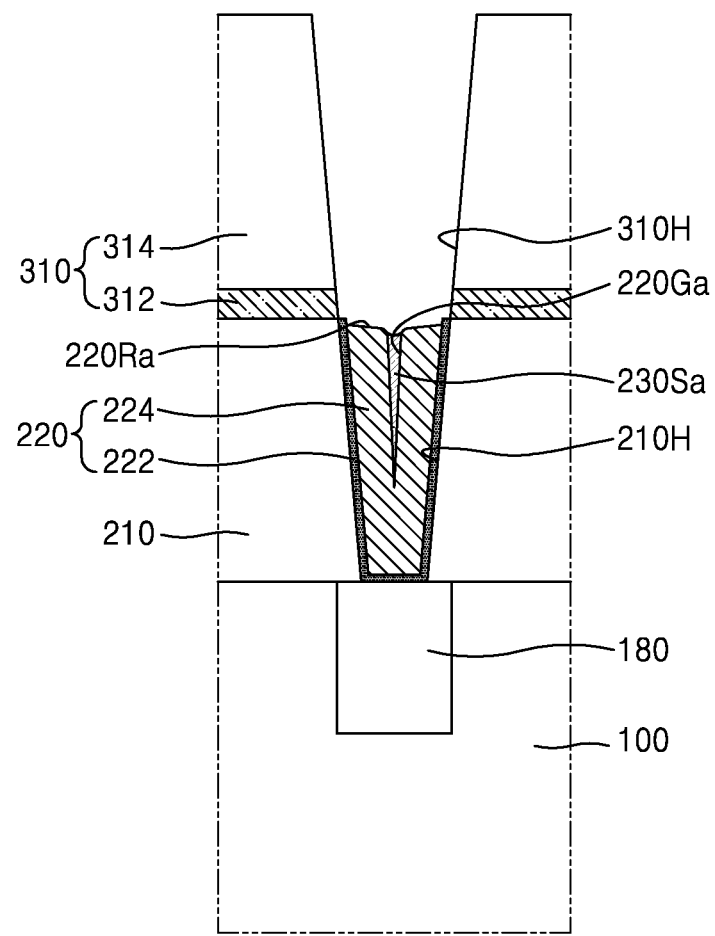

Referring to FIG. 17, the upper inter-wire insulating layer 310 including the upper contact hole 310H is formed over the lower inter-wire insulating layer 210 and the preliminary upper cover layer 230Ta of FIG. 16. While the upper contact hole 310H is formed, a portion of the preliminary plug cover layer 230a of FIG. 16 exposed at the bottom surface of the upper contact hole 310H may be removed. In some example embodiments, while the upper contact hole 310H is formed, the portion of the preliminary upper cover layer 230Ta of FIG. 16, which is exposed at the bottom surface of the upper contact hole 310H, may be removed and only the gap cover layer 230Sa may remain. Alternatively, in some example embodiments, a partial upper portion of the gap cover layer 230Sa may also be removed.

The top surface of the lower plug layer 224 may be exposed at the bottom surface of the upper contact hole 310H when the portion of the preliminary plug cover layer 230a is removed.

Figure 18:
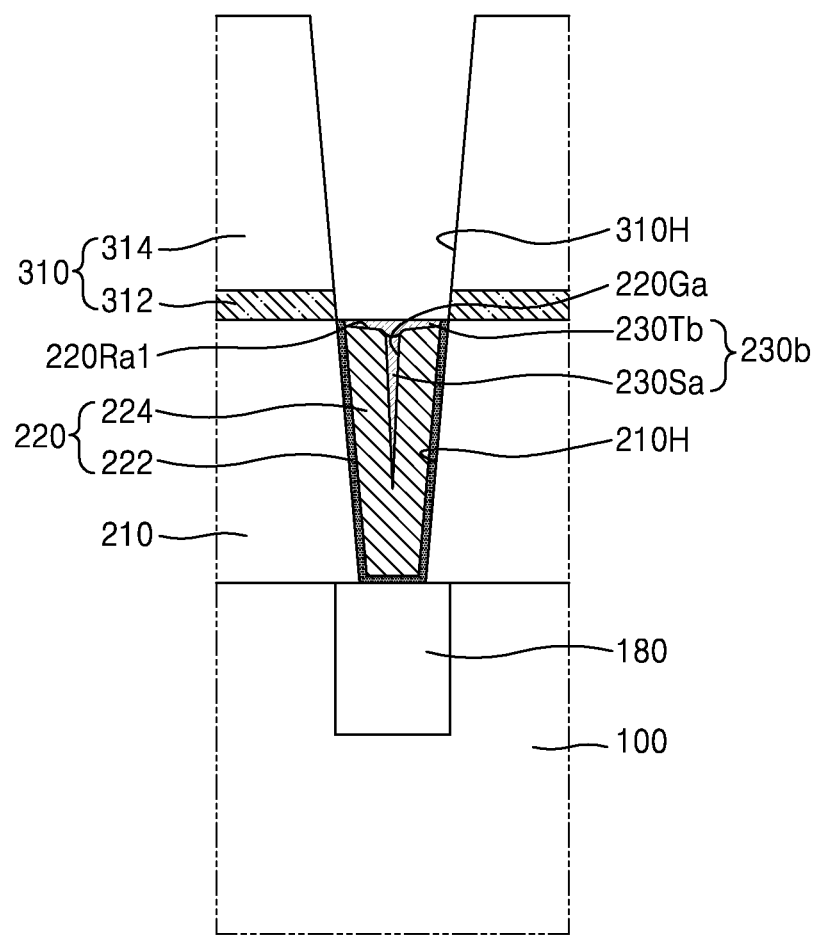

Referring to FIG. 18, an upper cover layer 230Tb is formed over a top surface of the gap cover layer 230Sa and a top surface of the lower plug layer 224, which is exposed at the bottom surface of the upper contact hole 310H. Accordingly, a plug cover layer 230b including the upper cover layer 230Tb and the gap cover layer 230Sa may cover a surface of the lower plug layer 224 formed over the lower barrier layer 222.

The upper cover layer 230Tb may not be formed over the surface of the lower barrier layer 222, but may be selectively formed over the surface of the lower plug layer 224. In this case, the plug cover layer 230b may not be formed over the top surface of the uppermost portion of the lower barrier layer 222.

Figure 19:
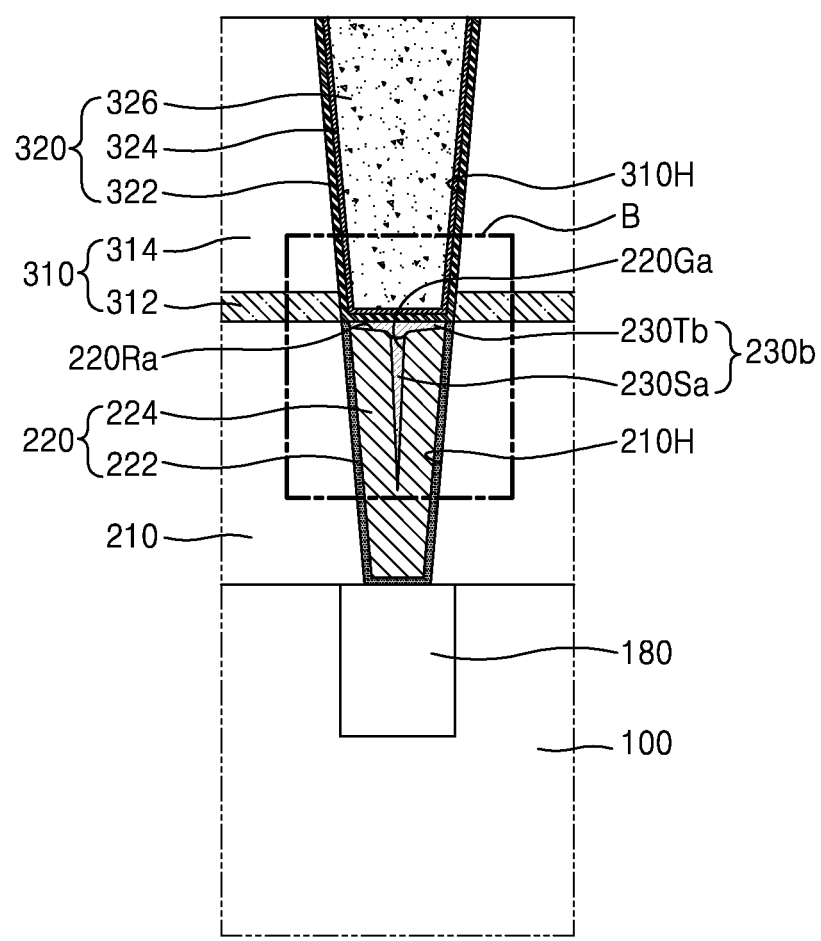

Referring to FIG. 19, the upper contact plug 320 is formed inside the upper contact hole 310H and electrically connected to the lower contact plugs 220 and 230b.

The semiconductor device 4 includes the plug cover layer 230b. The gap cover layer 230Sa of the plug cover layer 230b may fill the gap portion 220Ga corresponding to the seam 220S of FIG. 14 so as to reduce or prevent generation of a void in the lower plug layer 224 due to the seam 220S or to reduce or prevent moisture and/or impurities from remaining in the seam 220S, even when the seam 220S is generated inside the lower plug layer 224 while the lower plug layer 224 is formed.

Since the plug cover layer 230b, in particular, the upper cover layer 230Tb, covers the surface of the lower plug layer 224 exposed through the upper contact hole 310H, oxidation of a portion of the lower plug layer 224 may be reduced or prevented while the upper contact plug 320, in particular, the upper barrier layer 322, is formed.

Accordingly, electric resistance between the upper contact plug 320 and the lower contact plugs 220 and 230b may be reduced, and reliability of an electric connection may be increased.

Figure 20A:
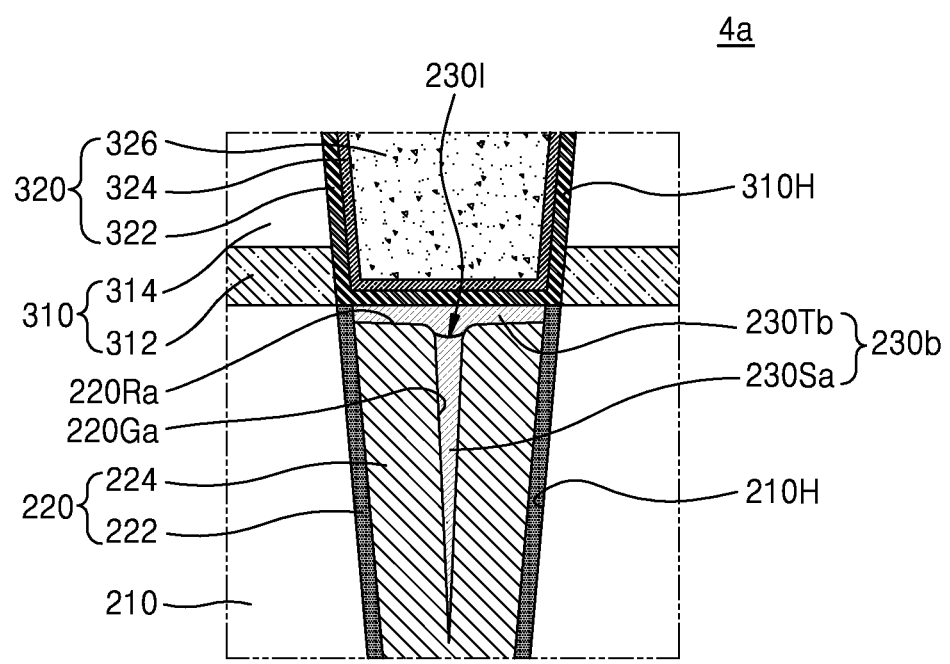
FIGS. 20A through 20C are cross-sectional views of semiconductor devices according to other example embodiments.
Figure 20B:
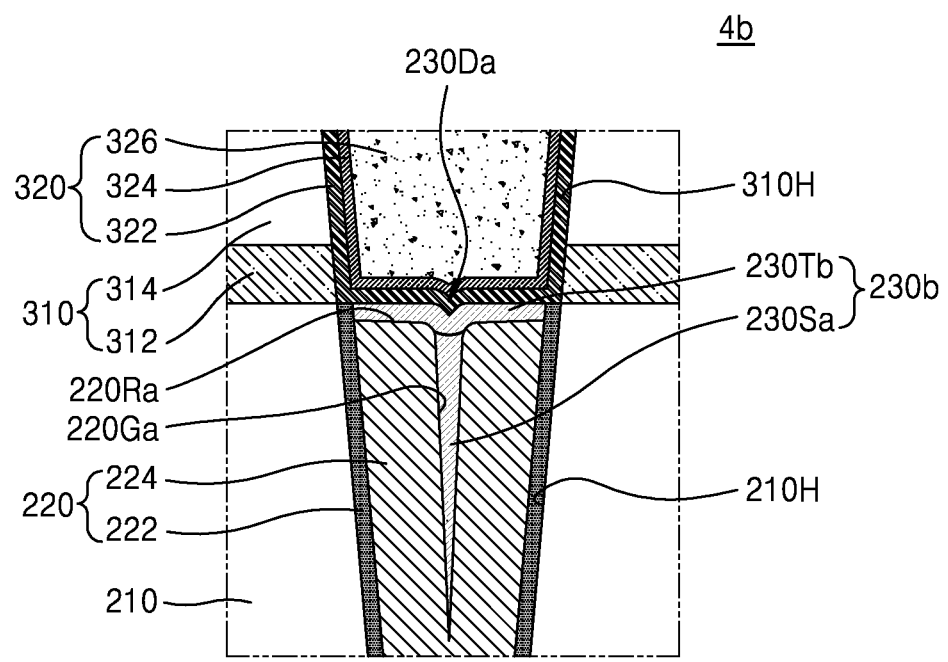
Figure 20C:
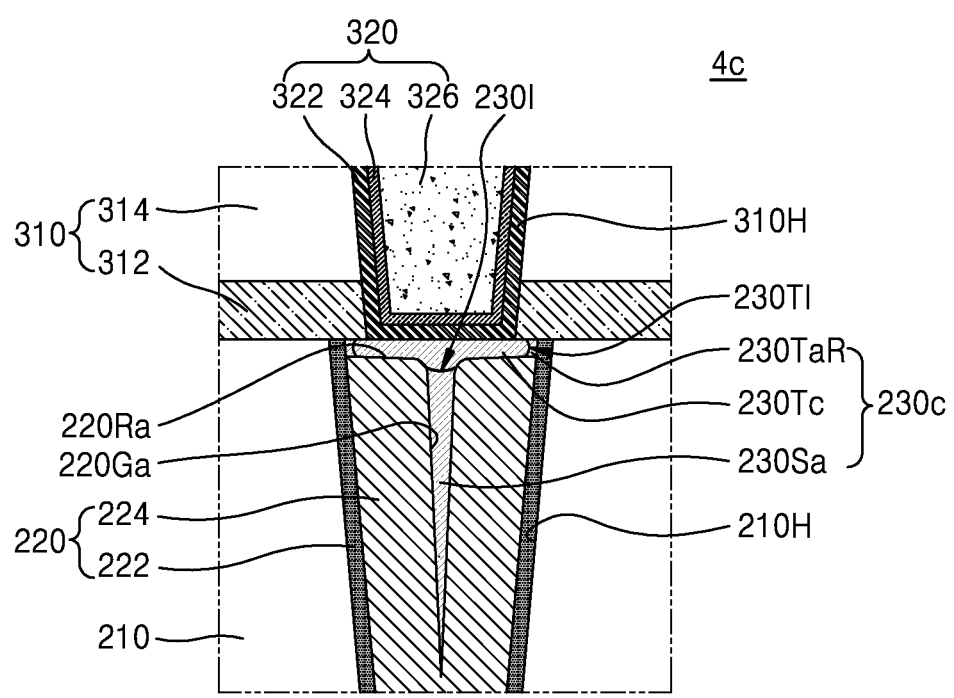

FIGS. 20A through 20C are cross-sectional views of semiconductor devices 4a through 4c according to other example embodiments. In detail, FIGS. 20A through 20C are enlarged cross-sectional views of aspects of the semiconductor devices 4a through 4c according to embodiments, which are obtained by enlarging a region B of FIG. 19. Descriptions provided with reference to FIGS. 20A through 20C, which are the same as those of FIG. 1 through 19, are not provided again.

Referring to FIG. 20A, the semiconductor device 4a includes the lower contact plugs 220 and 230b, and the upper contact plug 320 formed over the lower contact plugs 220 and 230b and electrically connected to the lower contact plugs 220 and 230b. The lower contact plugs 220 and 230b may fill the lower contact hole 210H and the upper contact plug 320 may fill the upper contact hole 310H.

The lower contact plugs 220 and 230b may include the plug base layer 220 and the plug cover layer 230b formed over the plug base layer 220. The plug base layer 220 may include the lower barrier layer 222 and the lower plug layer 224.

The lower plug layer 224 may be formed over the lower barrier layer 222 to limit the gap portion 220Ga at the center of the lower plug layer 224. The uppermost portion of the lower plug layer 224 may be located at a level lower than the uppermost portion of the lower barrier layer 222. The recess portion 220Ra communicating with the gap portion 220Ga may be limited between the uppermost portion of the lower barrier layer 222 and the top surface of the lower plug layer 224.

The plug cover layer 230b may include the gap cover layer 230Sa filling the gap portion 220Ga, and the upper cover layer 230Tb filling the recess portion 220Ra.

The gap cover layer 230Sa and the upper cover layer 230Tb may be separately formed. Accordingly, the plug cover layer 230b may have an interface 2301 between the gap cover layer 230Sa and the upper cover layer 230Tb.

Referring to FIG. 20B, the semiconductor device 4b includes the lower contact plugs 220 and 230b, and the upper contact plug 320 formed over the lower contact plugs 220 and 230b and electrically connected to the lower contact plugs 220 and 230b.

A second dimple 230Da may be formed at the top surface of the lower contact plugs 220 and 230b, i.e., at the top surface of the plug cover layer 230b. In some example embodiments, the second dimple 230Da may be transferred onto each of, or at least one of, the top surfaces of the upper barrier layer 322 and the linear cover layer 324.

Referring to FIG. 20C, the semiconductor device 4c includes lower contact plugs 220 and 230c, and the upper contact plug 320 formed over the lower contact plugs 220 and 230c and electrically connected to the lower contact plugs 220 and 230c.

In some example embodiments, a width of the lower most portion of the upper contact hole 310H may be narrower than a width of the uppermost portion of the lower contact hole 210H.

In this case, while the upper contact hole 310H is formed, a portion of the preliminary upper cover layer 230Ta of FIG. 16 may remain as a first upper cover layer 230TaR at least at a portion that does not overlap the bottom surface of the upper contact hole 310H.

While the preliminary upper cover layer 230Ta is removed, lateral loss, in which a portion of the preliminary upper cover layer 230Ta, which does not overlap the bottom surface of the upper contact hole 310H, is partially removed, may be generated. In this case, the first upper cover layer 230TaR may be formed over an outer portion of the top surface of the lower plug layer 224, which is spaced apart from a portion of the top surface of the lower plug layer 224 overlapping the bottom surface of the upper contact hole 310H.

A second upper cover layer 230Tc may be formed over a portion of the top surface of the lower plug layer 224, which is not covered by the first upper cover layer 230TaR, and over a side surface of the first upper cover layer 230TaR. The lower surface of the second upper cover layer 230Tc may contact the top surface of the gap cover layer 230Sa.

The semiconductor device 4c may include a plug cover layer 230c including: the gap cover layer 230Sa filling the gap portion 220Ga; and upper cover layers 230TaR and 230Tc including the first upper cover layer 230TaR and the second upper cover layer 230Tc, which cover the top surface of the lower plug layer 224. The plug cover layer 230c may have the interface 2301 between the gap cover layer 230Sa and the second upper cover layer 230Tc, and a surface 230TI between the first upper cover layer 230TaR and the second upper cover layer 230Tc.

In some example embodiments, as shown in FIG. 11C, lateral loss, in which a portion located below the inter-wire insulating film 314 is partially removed, may also be generated in the etch stop film 312.

Figure 21A:
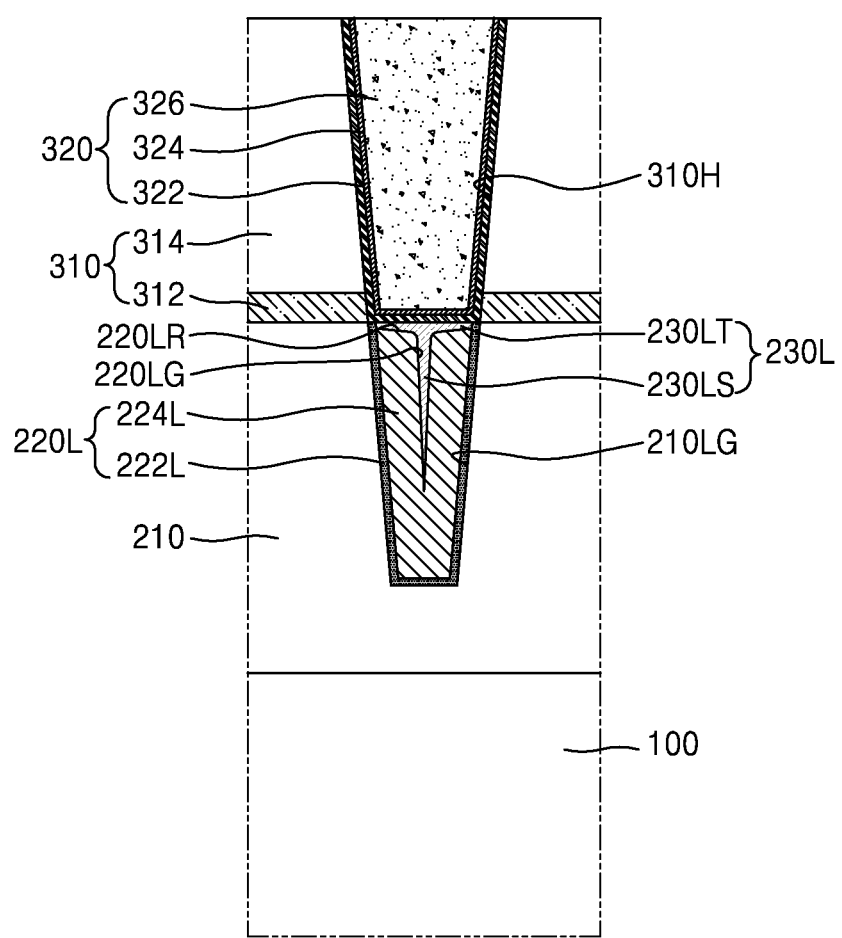
FIGS. 21A and 21B are cross-sectional views of a semiconductor device according to another example embodiment.
Figure 21B:
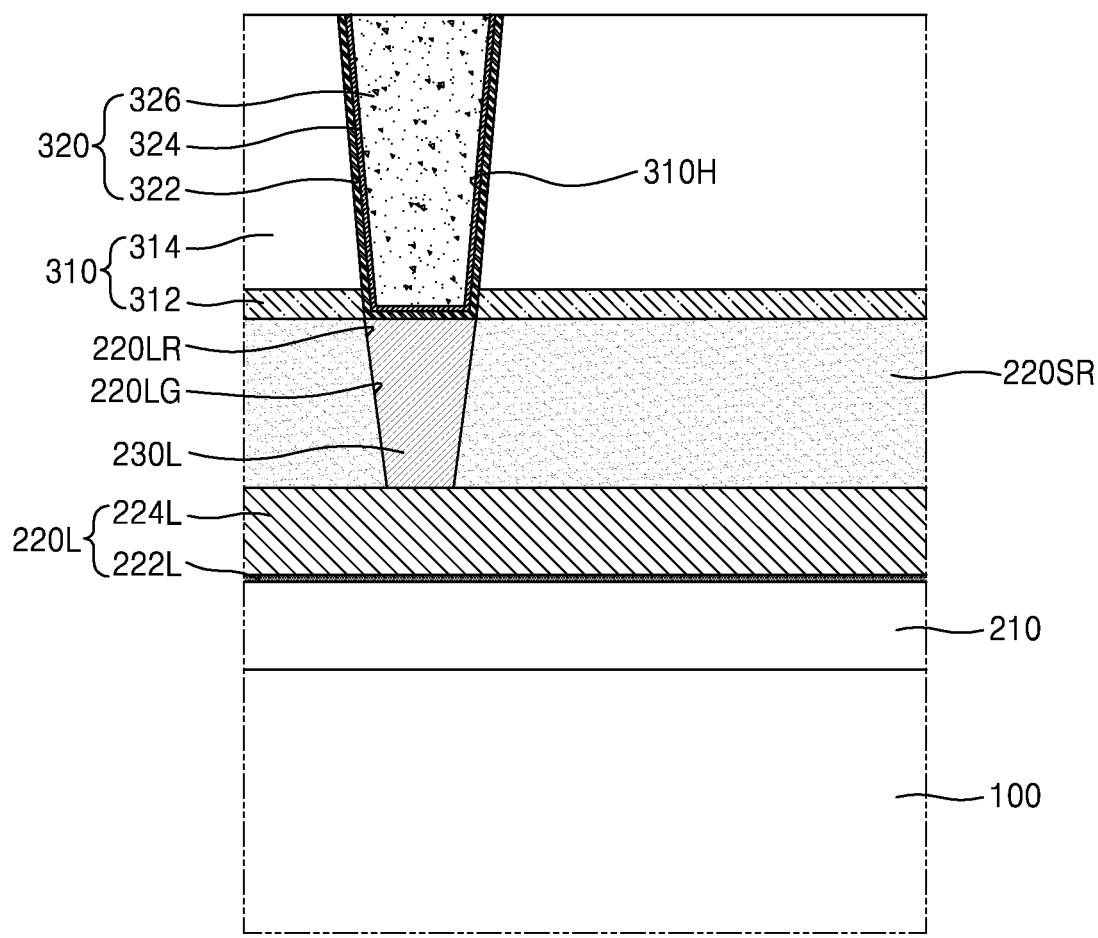

FIGS. 21A and 21B are cross-sectional views of a semiconductor device 5 according to another example embodiment. FIGS. 21A and 21B may be cross-sectional views of the semiconductor device 5 taken in different directions.

Referring to FIGS. 21A and 21B together, the semiconductor device 5 may include the base substrate 100 and the lower inter-wire insulating layer 210 located over the base substrate 100.

The lower inter-wire insulating layer 210 may include a groove 210LG extending from a top portion into the lower inter-wire insulating layer 210 in a direction parallel to a main surface of the base substrate 100. A bottom surface of the groove 210LG may be located at a level higher than a lower surface of the lower inter-wire insulating layer 210.

Lower wires 220L and 230L may be formed in the groove 210LG. The lower wires 220L and 230L may be disposed in the lower inter-wire insulating layer 210, and may have a top surface at the same level as a top surface of the lower inter-wire insulating layer 210. A lower surface of the lower wires 220L and 230L may be located at a level higher than a lower surface of the lower inter-wire insulating layer 210. As shown in FIG. 21B, the lower wires 220L and 230L may extend along a direction parallel to the main surface of the base substrate 100.

The lower wires 220L and 230L may include a wire base layer 220L and a wire cover layer 230L formed over the wire base layer 220L. In some example embodiments, the wire base layer 220L may be formed by a damascene process. The wire base layer 220L may include a lower barrier layer 222L and a lower wire layer 224L. The lower barrier layer 222L may cover side and lower surfaces of the lower wire layer 224L. The lower wire layer 224L may fill a portion of a space limited by the lower barrier layer 222L. The lower wire layer 224L may be formed over the lower barrier layer 222L to limit a gap portion 220LG and a recess portion 220LR at the center of the lower wire layer 224L.

The gap portion 220G and the recess portion 220R of the semiconductor device 1 in FIG. 10 are limited by the lower plug layer 224 included in the lower contact plugs 220 and 230 having an approximate cylindrical shape. However, the gap portion 220GL and the recess portion 220LR of the semiconductor device 5 in FIGS. 21A and 21B are limited by the lower wire layer 224L included in the lower wires 220L and 230L having an approximate line shape, and thus the gap portion 220LG and the recess portion 220LR may also extend along an extending direction of the lower wires 220L and 230L.

Accordingly, similarly to FIG. 12, the remaining seam 220SR may remain in the lower wires 220L and 230L. In detail, a gap cover layer 230LS and an upper cover layer 230LT respectively filling the gap portion 220LG and the recess portion 220LR may be formed at a portion and an adjacent portion overlapping the bottom surface of the upper contact hole 310H, i.e. the lower surface of the upper contact plug 320, but the remaining seam 220SR may remain inside the lower wire layer 224L spaced apart from the portion overlapping the upper contact plug 320. The remaining seam 220SR may contact the wire cover layer 230L. In other words, since the lower wires 220L and 230L of the semiconductor device 5 are similar to or the same as the lower contact plugs 220 and 230 of FIG. 12 continuously extending in a wide width direction, descriptions thereof are not provided again.

Figure 22:
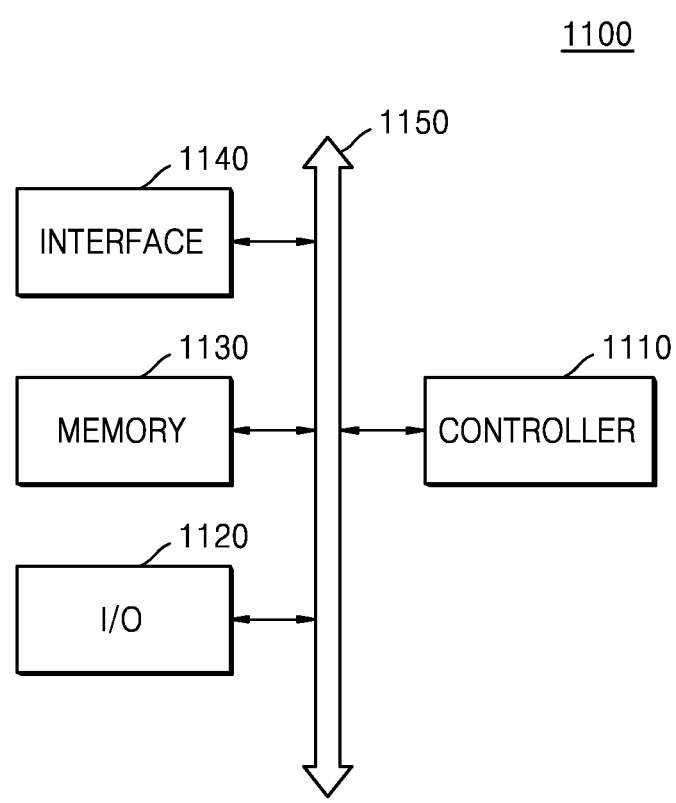
FIG. 22 is a block diagram of an electronic system according to an example embodiment.

FIG. 22 is a block diagram of an electronic system 1100 according to an example embodiment.

Referring to FIG. 22, the electronic system 1100 includes a controller 1110, an input/output (I/O) device 1120, a memory 1130, and an interface 1140, which are connected to each other through a bus 1150.

The controller 1110 may include at least one of a microprocessor, a digital signal processor, and a processing device similar thereto or the same thereas. The I/O device 1120 may include at least one of a keypad, a keyboard, and a display.

The memory 1130 may be used to store commands executed by the controller 1110. For example, the memory 1130 may be used to store user data.

The electronic system 1100 may include a wireless communication device or a device capable of transmitting and/or receiving information under a wireless environment. The interface 1140 may be a wireless interface so as to transmit/receive data through a wireless communication network in the electronic system 1100. The interface 1140 may include an antenna and/or a wireless transceiver. In some example embodiments, the electronic system 1100 may use a communication interface protocol of a $3^{rd}$ generation communication system, such as code division multiple access (CDMA), global system for mobile communication (GSM), North American digital cellular (NADC), extended-time division multiple access (E-TDMA), and/or wide band code division multiple access (WCDMA). The electronic system 1100 may include at least one of the semiconductor devices described above with reference to FIGS. 1 through 21B and semiconductor devices manufactured by methods described above with reference to FIGS. 1 through 21B and methods modified therefrom within the range of the technical ideas of the inventive concepts. Accordingly, since the electronic system 1100 includes a semiconductor device having reduced electric resistance and increased reliability of an electric connection, the electronic system 1100 may have a quick operation speed and high reliability.

While the inventive concepts have been particularly shown and described with reference to embodiments thereof, it will be understood that various changes in form and details may be made therein without departing from the spirit and scope of the following claims.

What is claimed is:

1. A semiconductor device comprising:
  a base substrate including a connection target layer;
  a lower contact plug over the base substrate and electrically connected to the connection target layer; and
  an upper contact plug over the lower contact plug,
  the lower contact plug including,
    a lower plug layer defining a gap portion extending inward from a top portion thereof;
    a gap cover layer filling the gap portion, the gap cover layer including a metallic material and having a wedge shape, a lowermost portion of the gap cover layer being above an uppermost portion of the connection target layer; and
    an upper cover layer covering a top surface of the lower plug layer.

2. The semiconductor device of claim 1, wherein the upper cover layer is between the lower plug layer and the upper contact plug such that the lower plug layer and the upper contact plug are not in direct contact with each other.

3. The semiconductor device of claim 1, wherein the gap cover layer and the upper cover layer include a different type of material from the lower plug layer.

4. The semiconductor device of claim 1, further comprising:
  a first interface between the gap cover layer and the upper cover layer.

5. The semiconductor device of claim 4, wherein the upper cover layer includes,
  a first upper cover layer including the first interface between the gap cover layer and the first upper cover layer; and a second upper cover layer in contact with a side surface of the first upper cover layer and including a second interface between the first upper cover layer and the second upper cover layer.

6. The semiconductor device of claim 1, wherein:
the lower contact plug further includes a lower barrier layer covering side and lower surfaces of the lower plug layer, and
an uppermost portion of the lower plug layer is at a lower level than an uppermost portion of the lower barrier layer.

7. The semiconductor device of claim 6, wherein the upper cover layer does not cover a top surface of the uppermost portion of the lower barrier layer.

8. The semiconductor device of claim 6, further comprising:
a groove portion corresponding to an upper portion of the lower barrier layer at a portion adjacent to an edge of a lower surface of the upper contact plug.

9. The semiconductor device of claim 6, wherein the lower plug layer is surrounded by the lower barrier layer, the upper cover layer, and the gap cover layer.

10. The semiconductor device of claim 1, wherein a top surface of the upper cover layer comprises a dimple having a concave shape.

11. The semiconductor device of claim 1, wherein:
a portion of a top surface of the lower plug layer does not overlap a lower surface of the upper contact plug, and
the upper cover layer is not over the portion of the top surface of the lower plug layer.

12. The semiconductor device of claim 11, wherein a seam in contact with the gap cover layer is defined inside the lower plug layer and spaced apart from a portion overlapping the lower surface of the upper contact plug.

13. The semiconductor device of claim 1, wherein the upper contact plug comprises a protruding portion at a lower portion of a side surface of the upper contact plug.

* * * * *